US012347782B2

(12) United States Patent
Ganesan et al.

(10) Patent No.: US 12,347,782 B2
(45) Date of Patent: Jul. 1, 2025

(54) MICROELECTRONIC ASSEMBLIES WITH DIRECT ATTACH TO CIRCUIT BOARDS

(71) Applicant: Intel Corporation, Santa Clara, CA (US)

(72) Inventors: Sanka Ganesan, Chandler, AZ (US); William J. Lambert, Chandler, AZ (US); Bharat Prasad Penmecha, Phoenix, AZ (US); Xavier Francois Brun, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 778 days.

(21) Appl. No.: 17/476,301

(22) Filed: Sep. 15, 2021

(65) Prior Publication Data

US 2023/0082706 A1     Mar. 16, 2023

(51) Int. Cl.
*H01L 23/538*     (2006.01)
*H01L 23/00*     (2006.01)
(Continued)

(52) U.S. Cl.
CPC ...... *H01L 23/5385* (2013.01); *H01L 23/3107* (2013.01); *H01L 23/5283* (2013.01); *H01L 23/53295* (2013.01); *H01L 23/5386* (2013.01); *H01L 23/5389* (2013.01); *H01L 24/32* (2013.01); *H01L 24/49* (2013.01); *H01L 25/0655* (2013.01); *H01L 25/0657* (2013.01); *H01L 2224/26152* (2013.01);
(Continued)

(58) Field of Classification Search
CPC . H01L 2924/00014; H01L 2224/45099; H01L 2224/48091; H01L 2924/181; H01L 2924/00012
See application file for complete search history.

(56) References Cited

U.S. PATENT DOCUMENTS 10,049,961 B1   8/2018   Qi et al.
10,103,088 B1   10/2018   Qi et al.
(Continued)

FOREIGN PATENT DOCUMENTS

CN          112652605 A     4/2021

OTHER PUBLICATIONS

U.S. Appl. No. 17/210,682, filed Mar. 24, 2021, Gomes et al.

*Primary Examiner* — Robert G Bachner
(74) *Attorney, Agent, or Firm* — Akona IP PC

(57) ABSTRACT

Microelectronic assemblies, related devices and methods, are disclosed herein. In some embodiments, a microelectronic assembly may include a first redistribution layer (RDL), having a first surface with first conductive contacts having a first pitch between 170 microns and 400 microns, an opposing second surface, and first conductive pathways between the first and second surfaces; a first die and a conductive pillar in a first layer on the first RDL; a second RDL on the first layer, the second RDL having a first surface, an opposing second surface with second conductive contacts having a second pitch between 18 microns and 150 microns, and second conductive pathways between the first and second surfaces; and a second die, in a second layer on the second RDL, electrically coupled to the first conductive contacts via the first conductive pathways, the conductive pillar, the second conductive pathways, and the second conductive contacts.

16 Claims, 12 Drawing Sheets

(51) Int. Cl.
*H01L 23/31* (2006.01)
*H01L 23/528* (2006.01)
*H01L 23/532* (2006.01)
*H01L 25/065* (2023.01)

(52) U.S. Cl.
CPC ............... *H01L 2224/32137* (2013.01); *H01L 2224/4903* (2013.01); *H01L 2224/49096* (2013.01); *H01L 2224/49174* (2013.01)

(56) References Cited

U.S. PATENT DOCUMENTS

| | | |
|---|---|---|
| 10,332,821 B2 | 6/2019 | Qi et al. |
| 2015/0069595 A1 | 3/2015 | Chen et al. |
| 2016/0020684 A1 | 1/2016 | Imai et al. |
| 2017/0365587 A1* | 12/2017 | Hung .................... H01L 21/486 |
| 2020/0091128 A1* | 3/2020 | Elsherbini ........... H01L 23/5386 |

* cited by examiner

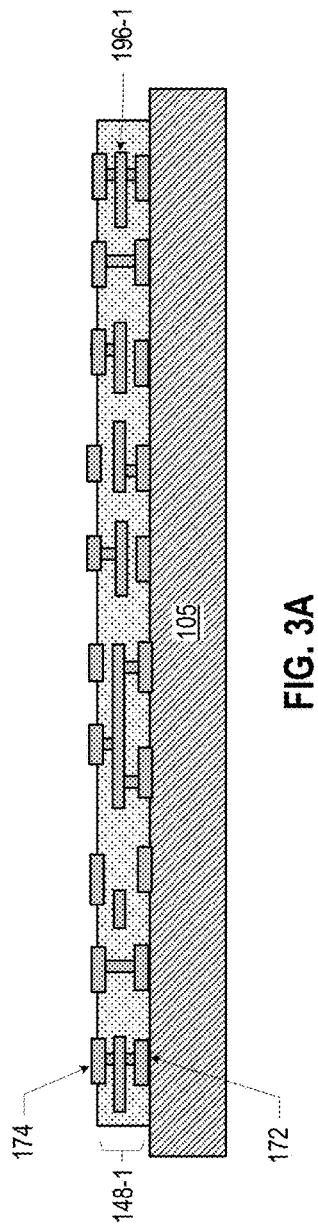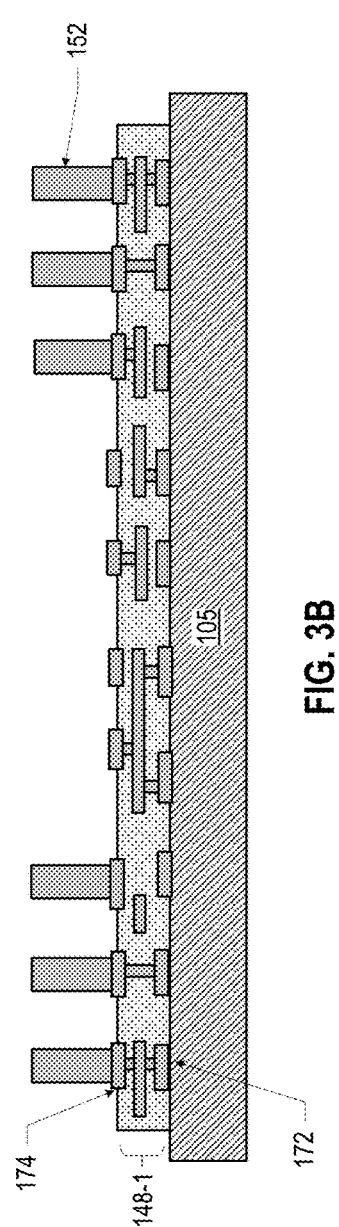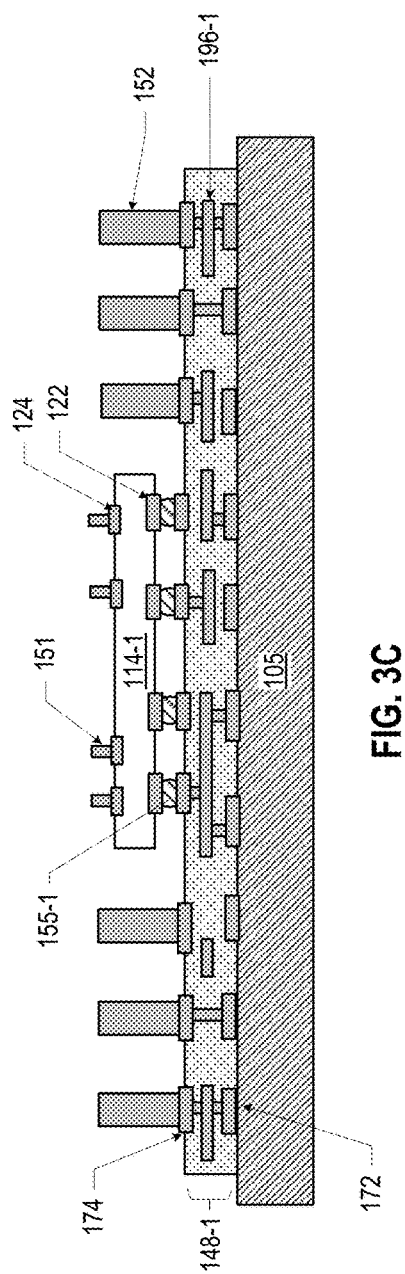

MICROELECTRONIC ASSEMBLIES WITH DIRECT ATTACH TO CIRCUIT BOARDS

BACKGROUND

Integrated circuit (IC) devices (e.g., dies) are typically coupled together in a multi-die IC package to integrate features or functionality and to facilitate connections to other components, such as package substrates. However, current techniques for coupling integrated circuit devices directly to circuit boards are limited by manufacturing, device size, and interconnect congestion, which may impact costs and implementations.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 3A-3G are side, cross-sectional views of various stages in an example process for manufacturing the microelectronic assembly of FIG. 1, in accordance with various embodiments.

DETAILED DESCRIPTION

Figure 1:
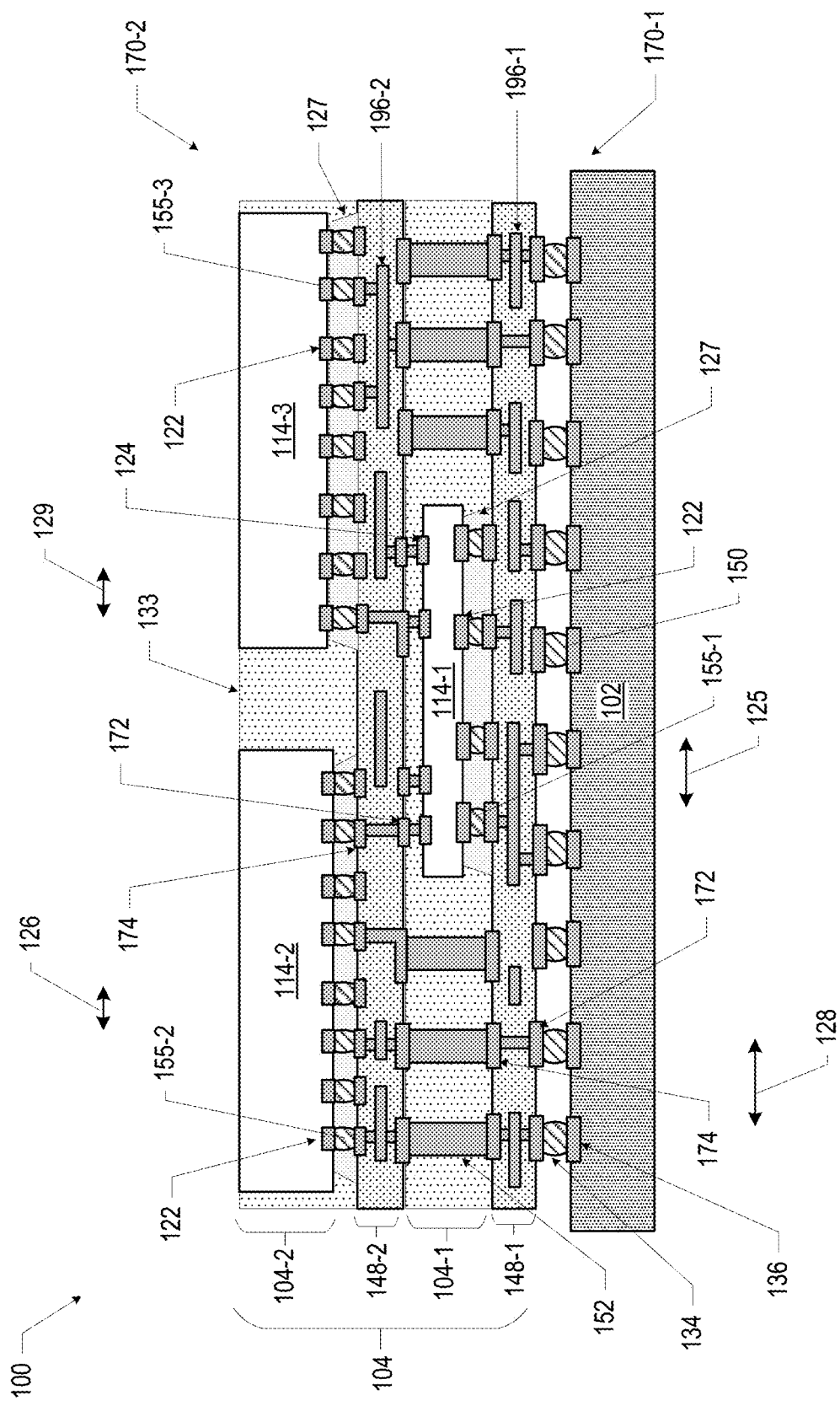
FIG. 1 is a side, cross-sectional view of an example microelectronic assembly, in accordance with various embodiments.

Microelectronic assemblies, related devices and methods, are disclosed herein. For example, in some embodiments, a microelectronic assembly may include a first redistribution layer (RDL), having a first surface, an opposing second surface, and first conductive pathways between the first and second surfaces, wherein the first surface of the first RDL includes first conductive contacts having a first pitch between 170 microns and 400 microns; a first die in a first layer, wherein the first layer is on the second surface of the first RDL; a conductive pillar in the first layer; a second RDL on the first layer, the second RDL having a first surface, an opposing second surface, and second conductive pathways between the first and second surfaces, wherein the second surface of the second RDL includes second conductive contacts having a second pitch between 18 microns and 150 microns; and a second die, in a second layer on the second RDL, wherein the second die is electrically coupled to the second conductive contacts and electrically coupled to the first conductive contacts via the first conductive pathways in the first RDL, the conductive pillar, the second conductive pathways in the second RDL, and the second conductive contacts.

Communicating large numbers of signals between two or more dies in a multi-die IC package is challenging due to the increasingly small size of such dies and increased use of stacking dies. This becomes more difficult for stacking of dies having different pitches because the variance in interconnect pitches at the bonding interfaces must be addressed. The desire to reduce the size of IC packages, including reducing an overall thickness, is still another factor that adds complexity. IC dies are conventionally coupled to a package substrate for mechanical stability and to facilitate connection to other components, such as circuit boards. Package substrates are typically relatively thick, on the order of tens or hundreds of micrometers (microns), resulting in thick final packages (i.e., resulting in packages having a relatively large z-height). Furthermore, communicating large numbers of signals between a circuit board, via the package substrate, and multiple dies in a multi-die IC package is challenging due to the increasingly small size of such dies, thermal constraints, and power delivery constraints, among others. Various ones of the embodiments disclosed herein may help achieve direct attachment of a multi-die IC package to a circuit board (e.g., an attach without a package substrate between a circuit board and a multi-die IC package). Various ones of the embodiments disclosed herein may help achieve direct attachment of multiple IC dies to a circuit board at a lower cost and with greater design flexibility, relative to conventional approaches. Various ones of the microelectronic assemblies disclosed herein may exhibit improved performance of individual dies, better power delivery, and faster signal speed while reducing an overall thickness of the package relative to conventional approaches.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" means "electrically insulating," unless otherwise specified. Throughout the specification, and in the claims, the term "coupled" means a direct or indirect connection, such as a direct electrical, mechanical, or magnetic connection between the things that are connected or an indirect connection, through one or more passive or active intermediary devices. The meaning of "a," "an," and "the" include plural references. The meaning of "in" includes "in" and "on." Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

When used to describe a range of dimensions, the phrase "between X and Y" represents a range that includes X and Y. For convenience, the phrase "FIG. 3" may be used to refer to the collection of drawings of FIGS. 3A-3G, the phrase "FIG. 4" may be used to refer to the collection of drawings of FIGS. 4A-4I, etc. Although certain elements may be referred to in the singular herein, such elements may include multiple sub-elements. For example, "an insulating material" may include one or more insulating materials.

FIG. 1 is a side, cross-sectional view of an example microelectronic assembly, in accordance with various embodiments. The microelectronic assembly 100 may include a multi-layer die subassembly 104 having an RDL 148 and die-complex-to-board (DCTB) interconnects 150. As used herein, the term a "multi-layer die subassembly" 104 may refer to a composite die having two or more stacked dielectric layers with one or more dies in each layer, and conductive interconnects and/or conductive pathways connecting the one or more dies, including dies in non-adjacent layers. As used herein, the terms a "multi-layer die subassembly" and a "composite die" may be used interchangeably. The multi-layer die subassembly 104 may include a first surface 170-1 and an opposing second surface 170-2. As shown in FIG. 1, the multi-layer die subassembly 104 may include a first RDL 148-1 having DCTB interconnects 150 on a bottom surface (e.g., at a first surface 170-1), a first layer 104-1 on the first RDL 148-1 having a die 114-1 and conductive pillars 152, a second RDL 148-2 on the first layer 104-1, and a second layer 104-2 on the second RDL 148-2 having a die 114-2 and a die 114-3. As used herein, DCTB interconnects 150 may include conductive contacts 172 on the bottom surface of the first RDL 148-1, and may further include solder 134, or other interconnect structures, and may further include conductive contacts 136 on a surface of the circuit board 102. The multi-layer die subassembly 104 may be coupled to a circuit board 102 via the DCTB interconnects 150.

The DCTB interconnects 150 disclosed herein may take any suitable form, including solder balls for a ball grid array arrangement, pins in a pin grid array arrangement or lands in a land grid array arrangement. In some embodiments, the DCTB interconnects 150 may include solder 134 (e.g., solder bumps or balls that are subject to a thermal reflow to form the interconnects), as shown. In some embodiments, the DCTB interconnects 150 may include an anisotropic conductive material, such as an anisotropic conductive film or an anisotropic conductive paste. An anisotropic conductive material may include conductive materials dispersed in a non-conductive material. In some embodiments, a pitch 128 of the DCTB interconnects may be between 170 microns and 400 microns. As used herein, DCTB interconnects 150 may include conductive contacts 172 on the bottom surface of the first RDL 148-1, and may further include solder 134, or other interconnect structures, and may further include conductive contacts 136 on a surface of the circuit board 102. The multi-layer die subassembly 104 may be coupled to a circuit board 102 via the DCTB interconnects 150.

The die 114-1 may include a set of conductive contacts 122 on a bottom surface and a set of conductive contacts 124 on a top surface of the die 114-1. The dies 114-2, 114-3 may include a set of conductive contacts 122 on a bottom surface of the dies 114-2, 114-3. The die 114 may include other conductive pathways (e.g., including lines and vias) and/or to other circuitry (not shown) coupled to the respective conductive contacts (e.g., conductive contacts 122, 124) on the surface of the die 114. The dies 114-2, 114-3 in the second layer 104-2 may be coupled to the conductive pillars 152 to form multi-level (ML) interconnects. In particular, the dies 114-2, 114-3 may be coupled to the circuit board 102 via the conductive pillars 152 and conductive pathways 196 in the first and second RDLs 148-1, 148-2. The ML interconnects may be power delivery interconnects or high speed signal interconnects. As used herein, the term "ML interconnect" may refer to an interconnect that includes a conductive pillar between a first component and a second component where the first component and the second component are not in adjacent layers, or may refer to an interconnect that spans one or more layers (e.g., an interconnect between a first die in a first layer and a second die in a third layer, or an interconnect between a package substrate and a die in a second layer).

As used herein, a "conductive contact" may refer to a portion of conductive material (e.g., metal) serving as an electrical interface between different components (e.g., as part of an interconnect); conductive contacts may be recessed in, flush with, or extending away from a surface of a component, and may take any suitable form (e.g., a conductive pad or socket, or portion of a conductive line or via). In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "metal traces," "lines," "metal lines," "wires,"

"metal wires," "trenches," or "metal trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PIC. In such cases, the term "interconnect" may refer to optical waveguides (e.g., structures that guide and confine light waves), including optical fiber, optical splitters, optical combiners, optical couplers, and optical vias.

The RDLs 148 (e.g., the first RDL 148-1 and the second RDL 148-2) may include an insulating material (e.g., a dielectric material formed in multiple layers, as known in the art) and one or more conductive pathways 196 (e.g., conductive pathways 196-1 in the first RDL 148-1 and conductive pathways 196-2 in the second RDL 148-2), through the dielectric material (e.g., including conductive traces and/or conductive vias, as shown). The RDLs 148 may include a set of conductive contacts 172 on the bottom surface of the RDL 148 and a set of conductive contacts 174 on the top surface of the RDL 148. In some embodiments, the insulating material of the RDL 148 may be composed of dielectric materials, bismaleimide triazine (BT) resin, polyimide materials, epoxy materials (e.g., glass reinforced epoxy matrix materials, epoxy build-up films, or the like), mold materials, oxide-based materials (e.g., silicon dioxide or spin on oxide), or low-k and ultra low-k dielectric (e.g., carbon-doped dielectrics, fluorine-doped dielectrics, porous dielectrics, and organic polymeric dielectrics).

As shown for the die 114-1, the conductive contacts 122 on the bottom surface of the die 114-1 may be electrically and mechanically coupled to the conductive contacts 174 on the top surface of the first RDL 148-1 by die-to-RDL (DTRDL) interconnects 155-1. In some embodiments, a pitch 125 of the DTRDL interconnects 155-1 is between 40 microns and 150 microns. As shown for the dies 114-2, 114-3, the conductive contacts 122 on the bottom surface of the dies 114-2, 114-3 may be electrically and mechanically coupled to the conductive contacts 174 on the top surface of the second RDL 148-2 by DTRDL interconnects 155-2, 155-3, respectively. In some embodiments, a pitch 126 of the DTRDL interconnects 155-2 may be between 18 microns and 150 microns. In some embodiments, a pitch 129 of the DTRDL interconnects 155-3 may be between 18 microns and 150 microns. In some embodiments, a pitch 126 of the DTRDL interconnects 155-2 may be equal to a pitch 129 of the DTRDL interconnects 155-3. In some embodiments, a pitch 126 of the DTRDL interconnects 155-2 may be different than a pitch 129 of the DTRDL interconnects 155-3. The RDL 148, via conductive pathways 196, may provide for the ability to fan-out DTRDL interconnects 155 to DCTB interconnects 150. Any suitable technique may be used to form the DTRDL interconnects 155 disclosed herein, such as plating techniques, solder techniques, or anisotropic conductive material techniques. As shown for the dies 114-2, 114-3, the conductive contacts 122 on the bottom surface of the dies 114-2, 114-3 may be electrically coupled conductive pillars 152 in the first layer 104-1 via the conductive contacts 172, 174 and the conductive pathways 196-2 in the second RDL 148-2. In some embodiments, a conductive contact 174 on a top surface of the first RDL 148-1 and/or a conductive contact 172 on a bottom surface of the second RDL 148-2 may be coupled to a conductive pillar 152 by non-solder interconnects, such as metal-to-metal.

The die 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imagable dielectrics, and/or benzocyclobutene-based polymers). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The conductive pathways in a die 114 may include conductive traces and/or conductive vias, and may connect any of the conductive contacts in the die 114 in any suitable manner (e.g., connecting multiple conductive contacts on a same surface or on different surfaces of the die 114). Example structures that may be included in the dies 114 disclosed herein are discussed below with reference to FIG. 6. The conductive pathways in the dies 114 may be bordered by liner materials, such as adhesion liners and/or barrier liners, as suitable. In some embodiments, the die 114 is a wafer. In some embodiments, the die 114 is a monolithic silicon, a fan-out or fan-in package die, or a die stack (e.g., wafer stacked, die stacked, or multi-layer die stacked).

In some embodiments, the die 114 may include conductive pathways to route power, ground, and/or signals to/from other dies 114 included in the microelectronic assembly 100. For example, the die 114-1 may include TSVs (not shown), including a conductive material via, such as a metal via, isolated from the surrounding silicon or other semiconductor material by a barrier oxide), or other conductive pathways through which power, ground, and/or signals may be transmitted between the circuit board 102 and one or more dies 114 "on top" of the die 114-1 (e.g., in the embodiment of FIG. 1, the dies 114-2 and/or 114-3). In some embodiments, the die 114-1 may not route power and/or ground to the dies 114-2 and 114-3; instead, the dies 114-2, 114-3 may couple directly to power and/or ground lines in the circuit board 102 by ML interconnects (e.g., via conductive contacts 132 and conductive pillars 152). In some embodiments, the die 114-1 in the first layer 104-1, also referred to herein as "base die," "interposer die," or bridge die," may be thicker than the dies 114-2, 114-3 in the second layer 104-2. In some embodiments, a die 114 may span multiple layers of the multi-layer die subassembly 104 (e.g., may span first layer 104-1 and second RDL 148-2). In some embodiments, the die 114-1 may be a memory device (e.g., as described below with reference to the die 1502 of FIG. 5), a high frequency serializer and deserializer (SerDes), such as a Peripheral Component Interconnect (PCI) express. In some embodiments, the die 114-1 may be an embedded multi-die interconnect bridge (EMIB), a processing die, a radio frequency chip, a power converter, a network processor, a workload accelerator, or a security encryptor. In some embodiments, the die 114-2 and/or the die 114-3 may be a processing die.

The multi-layer die subassembly 104 may include an insulating material 133 (e.g., a dielectric material formed in multiple layers, as known in the art) to form the multiple layers and to embed one or more dies in a layer. In particular, the first die 114-1 and conductive pillars 152 may be embedded in the insulating material 133 in the first layer 104-1 and the second and third dies 114-2, 114-3 may be embedded in the insulating material 133 in the second layer 104-2. In some embodiments, the insulating material 133 of the multi-layer die subassembly 104 may be a dielectric material, such as an organic dielectric material, a fire retardant grade 4 material (FR-4), bismaleimide triazine (BT) resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). In some embodiments, the die 114 may be embedded in an inhomogeneous dielectric, such as stacked dielectric layers (e.g., alternating layers of different inorganic dielectrics). In some embodiments, the insulating material 133 of the multi-layer die subassembly 104 may be a mold material, such as an organic polymer with inorganic silica particles. The multi-layer die subassembly 104 may include one or more ML interconnects through the dielectric material (e.g., including conductive vias and/or conductive pillars, as shown). The multi-layer die subassembly 104 may have any suitable dimensions. For example, in some embodiments, a thickness of the multi-layer die subassembly 104 may be between 100 um and 2000 um. In some embodiments, the multi-layer die subassembly 104 may include a composite die, such as stacked dies. The multi-layer die subassembly 104 may have any suitable number of layers, any suitable number of dies, any suitable die arrangement, and any suitable number of RDLs. For example, in some embodiments, the multi-layer die subassembly 104 may have between 3 and 20 layers of dies. In some embodiments, the multi-layer die subassembly 104 may include a layer having between 2 and 50 dies. In some embodiments, the multi-layer die subassembly 104 may include three or more RDLs.

The circuit board 102 may include an insulating material (e.g., a dielectric material formed in multiple layers, as known in the art) and one or more conductive pathways to route power, ground, and signals through the dielectric material (e.g., including conductive traces and/or conductive vias, as shown). In some embodiments, the circuit board may be a mother board or a printed circuit board (PCB), and may be a third-party circuit board. In some embodiments, the insulating material of the circuit board 102 may be a dielectric material, such as an organic dielectric material, a fire retardant grade 4 material (FR-4), BT resin, polyimide materials, glass reinforced epoxy matrix materials, organic dielectrics with inorganic fillers or low-k and ultra low-k dielectric (e.g., carbon-doped dielectrics, fluorine-doped dielectrics, porous dielectrics, and organic polymeric dielectrics). In particular, when the circuit board 102 is formed using standard PCB processes, the circuit board 102 may include FR-4, and the conductive pathways in the circuit board 102 may be formed by patterned sheets of copper separated by build-up layers of the FR-4. The conductive pathways in the circuit board 102 may be bordered by liner materials, such as adhesion liners and/or barrier liners, as suitable. In some embodiments, the circuit board 102 may be formed using a lithographically defined via packaging process. In some embodiments, the circuit board 102 may be manufactured using standard organic package manufacturing processes, and thus the circuit board 102 may take the form of an organic package. In some embodiments, the circuit board 102 may be a set of redistribution layers formed on a panel carrier by laminating or spinning on a dielectric material, and creating conductive vias and lines by laser drilling and plating. In some embodiments, the circuit board 102 may be formed on a removable carrier using any suitable technique, such as a redistribution layer technique. Any method known in the art for fabrication of the circuit board 102 may be used, and for the sake of brevity, such methods will not be discussed in further detail herein.

In some embodiments, the circuit board 102 may be a lower density medium and the die 114 may be a higher density medium or have an area with a higher density medium. As used herein, the term "lower density" and "higher density" are relative terms indicating that the conductive pathways (e.g., including conductive interconnects, conductive lines, and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted copper, and with coarse vertical interconnect features formed by a standard laser process). In other embodiments, the higher density medium may be manufactured using semiconductor fabrication process, such as a single damascene process or a dual damascene process. In some embodiments, additional dies may be disposed on the top surface of the dies 114-2, 114-3. In some embodiments, additional components may be disposed on the top surface of the dies 114-2, 114-3. Additional passive components, such as surface-mount resistors, capacitors, and/or inductors, may be disposed on the top surface or the bottom surface of the circuit board 102.

The microelectronic assembly 100 of FIG. 1 may also include an underfill material 127. In some embodiments, the underfill material 127 may extend between the die 114-1 and the first RDL 148-1 around the associated DTRDL interconnects 155-1 and/or between the dies 114-2, 114-3 and the second RDL 148-2 around the associated DTRDL interconnects 155-2, 155-3. The underfill material 127 may be an insulating material, such as an appropriate epoxy material. In some embodiments, the underfill material 127 may include a capillary underfill, non-conductive film (NCF), or molded underfill. In some embodiments, the underfill material 127 may include an epoxy flux that assists with soldering the die 114-1 to the circuit board 102 when forming the DTRDL interconnects 155, and then polymerizes and encapsulates the DTRDL interconnects 155. The underfill material 127 may be selected to have a coefficient of thermal expansion (CTE) that may mitigate or minimize the stress between the die 114 and the RDL 148 arising from uneven thermal expansion in the microelectronic assembly 100. In some embodiments, the CTE of the underfill material 127 may have a value that is intermediate to the CTE of the die 114 (e.g., the CTE of the dielectric material of the die 114) and a CTE of the RDL 148.

Although FIG. 1 depicts a multi-layer die subassembly 104 having a particular number of dies 114 coupled to the circuit board 102 and to other dies 114, this number and arrangement are simply illustrative, and a multi-layer die subassembly 104 may include any desired number and arrangement of dies 114 coupled to a circuit board 102. Although FIG. 1 shows the die 114-1 as a double-sided die and the dies 114-2, 114-3 as single-sided dies, the dies 114 may be a single-sided or a double-sided die and may be a single-pitch die or a mixed-pitch die. In some embodiments, additional components may be disposed on the top surface of the dies 114-2 and/or 114-3. In this context, a double-sided die refers to a die that has connections on both surfaces. In some embodiments, a double-sided die may include through silicon vias (TSVs) to form connections on both surfaces. The active surface of a double-sided die, which is the surface containing one or more active devices and a majority of interconnects, may face either direction depending on the design and electrical requirements.

Many of the elements of the microelectronic assembly 100 of FIG. 1 are included in other ones of the accompanying drawings; the discussion of these elements is not repeated when discussing these drawings, and any of these elements may take any of the forms disclosed herein. Further, a number of elements are illustrated in FIG. 1 as included in the microelectronic assembly 100, but a number of these elements may not be present in a microelectronic assembly 100. For example, in various embodiments, the underfill material 127 and the circuit board 102 may not be included. In some embodiments, individual ones of the microelectronic assemblies 100 disclosed herein may serve as a system-in-package (SiP) in which multiple dies 114 having different functionality are included. In such embodiments, the microelectronic assembly 100 may be referred to as an SiP.

Figure 2:
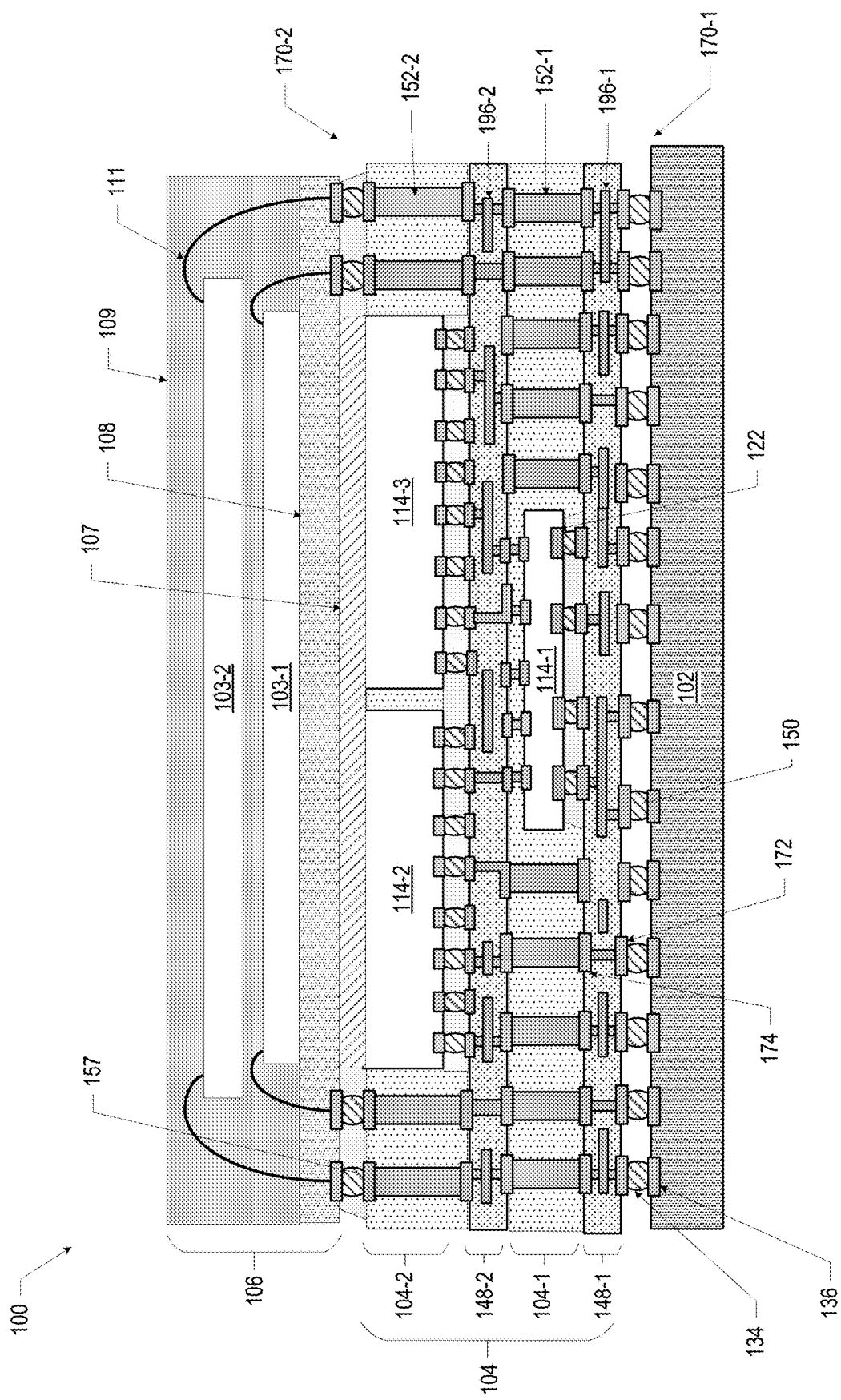
FIG. 2 is a side, cross-sectional view of an example microelectronic assembly, in accordance with various embodiments.

FIG. 2 is a side, cross-sectional view of an example microelectronic assembly, in accordance with various embodiments. The microelectronic assembly 100 may include a multi-layer die subassembly 104 having an RDL 148, DCTB interconnects 150, and a third-party package 106. The multi-layer die subassembly 104 may include a first surface 170-1 and an opposing second surface 170-2. As shown in FIG. 2, the multi-layer die subassembly 104 may include a first RDL 148-1 having DCTB interconnects 150 on a bottom surface (e.g., at a first surface 170-1), a first layer 104-1 on the first RDL 148-1 having a die 114-1 and first conductive pillars 152, a second RDL 148-2 on the first layer 104-1, a second layer 104-2 on the second RDL 148-2 having a die 114-2, a die 114-3, and second conductive pillars, and an third-party package on the second layer and electrically coupled to the second conductive pillars. The multi-layer die subassembly 104 may be coupled to a circuit board 102 via the DCTB interconnects 150. The third-party package 106 may include an in-package memory, such as a lower power memory package, or a 5G modem. For example, a third-party package 106 may include a first memory device 103-1 and a second memory device 103-2 (e.g., (e.g., a memory device such as a dynamic random access memory (DRAM)) on a substrate layer 108 and embedded in a mold material 109 coupled to a top surface of the second layer 104-2 by an adhesive 107 and electrically coupled to the second conductive pillars via wire bonds 111 and solder interconnects 157.

Any suitable techniques may be used to manufacture the microelectronic assemblies 100 disclosed herein. For example, FIGS. 3A-3G are side, cross-sectional views of various stages in an example process for manufacturing the microelectronic assembly 100 of FIG. 1, in accordance with various embodiments. Although the operations discussed below with reference to FIGS. 3A-3G (and others of the accompanying drawings representing manufacturing processes) are illustrated in a particular order, these operations may be performed in any suitable order. Further, additional operations which are not illustrated may also be performed without departing from the scope of the present disclosure. Also, various ones of the operations discussed herein with respect to FIGS. 3A-3G may be modified in accordance with the present disclosure to fabricate others of microelectronic assembly 100 disclosed herein.

FIG. 3A illustrates an assembly subsequent to forming a first RDL 148-1 on a carrier 105. A carrier 105 may include any suitable material for providing mechanical stability during manufacturing operations, and in some embodiments, may include a semiconductor wafer (e.g., a silicon wafer) or glass (e.g., a glass panel). The first RDL 148-1 may include conductive pathways 196-1 between conductive contacts 172 on a bottom surface and conductive contacts 174 on a top surface of the first RDL 148-1. The first RDL 148-1 may be manufactured using any suitable technique, such as a PCB technique or a redistribution layer technique.

FIG. 3B illustrates an assembly subsequent to depositing a conductive material, such as copper, on a top surface of the first RDL 148-1 to generate conductive pillars 152. The conductive pillars 152 may be formed using any suitable technique, for example, a lithographic process or an additive process, such as cold spray or 3-dimensional printing. The conductive pillars 152 may have any suitable dimensions. In some embodiments, the conductive pillars 152 may span one or more layers. For example, in some embodiments, an individual conductive pillar 152 may have an aspect ratio (height:diameter) between 0.5:1 and 4:1 (e.g., between 1:1 and 3:1). In some embodiments, an individual conductive pillar 152 may have a diameter (e.g., cross-section) between 10 microns and 1000 microns. For example, an individual conductive pillar 152 may have a diameter between 50 microns and 150 microns. In some embodiments, an individual conductive pillar 152 may have a height (e.g., z-height or thickness) between 50 and 150 microns. In some embodiments, the conductive pillars 152 have a pitch between 75 microns and 150 microns. The conductive pillars 152 may have any suitable cross-sectional shape, for example, square, triangular, and oval, among others.

FIG. 3C illustrates an assembly subsequent to placing die 114-1 a top surface of the first RDL 148-1 and forming first DTRDL interconnects 155-1. Any suitable method may be used to place the die 114-1, for example, automated pick-and-place. The die 114-1 may include a set of first conductive contacts 122 on a bottom surface and a set of second conductive contacts 124 on a top surface. Additional metal traces and/or small pillars 151 may be formed on the die 114-1. In some embodiments, metal traces and/or small pillars 151 may be formed on the die 114-1 prior to placing them on the carrier 105. In some embodiments, first DTRDL interconnects 155-1 may include solder. In such embodiments, the assembly of FIG. 3C may be subjected to a solder reflow process during which solder components of first DTRDL interconnects 155-1 melt and bond to mechanically and electrically couple the die 114-1 to the top surface of the first RDL 148-1.

Figure 3D:
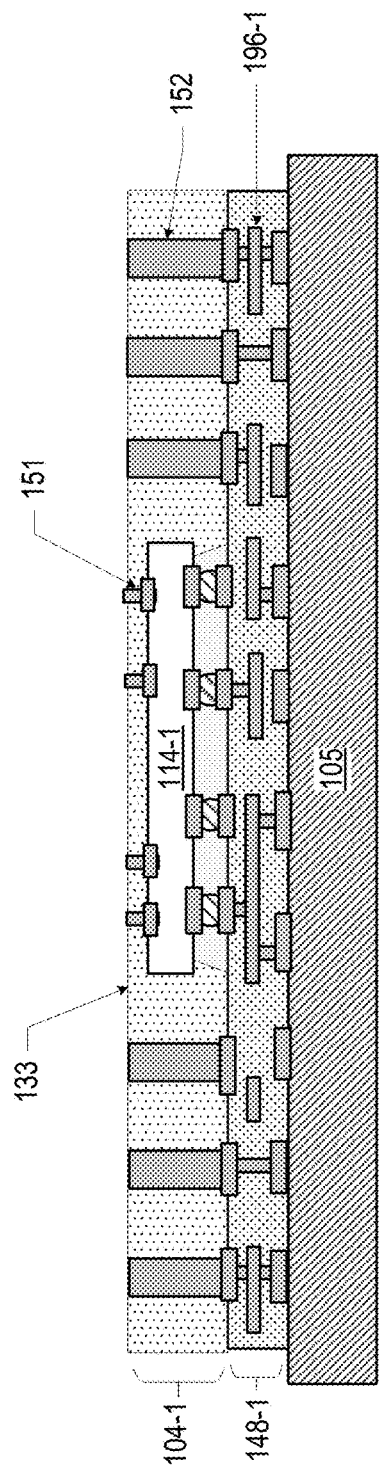

FIG. 3D illustrates an assembly subsequent to depositing an insulating material 133 on and around the die 114-1 and the conductive pillars 152. The insulating material 133 may be a mold material, such as an organic polymer with inorganic silica particles, an epoxy material, or a silicon and nitrogen material (e.g., in the form of silicon nitride). In some embodiments, the insulating material 133 is a dielectric material. In some embodiments, the dielectric material may include an organic dielectric material, a fire retardant grade 4 material (FR-4), BT resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). The insulating material 133 may be formed using any suitable process, including lamination, or slit coating and curing. In some embodiments, the insulating material 133 may be dispensed in liquid form to flow around and conform to various shapes of components and metallization, and, subsequently, may be subjected to a process, for example, curing, that solidifies the insulating material 133. In some embodiments, the insulating material 133 may be initially deposited on and over the top surface of the die 114-1 and the conductive pillars 152, then polished back to expose the top surface of the small pillars 151 on the die 114-1 and the conductive pillars 152. If the insulating material 133 is formed to completely cover the die 114-1 and the conductive pillars 152, the insulating material 133 may be removed using any suitable technique, including grinding, or etching, such as a wet etch, a dry etch (e.g., a plasma etch), a wet blast, or a laser ablation (e.g., using excimer laser). In some embodiments, the thickness of the insulating material 133 may be minimized to reduce the etching time required. In some embodiments, the top surface of the insulating material 133 may be planarized using any suitable process, such as chemical mechanical polishing (CMP). In some embodiments, underfill 127 may be dispensed around the DTRDL interconnects 155-1 prior to depositing the insulating material 133. In some embodiments, underfill 127 around the DTRDL interconnects 155-1 may be omitted.

Figure 3E:
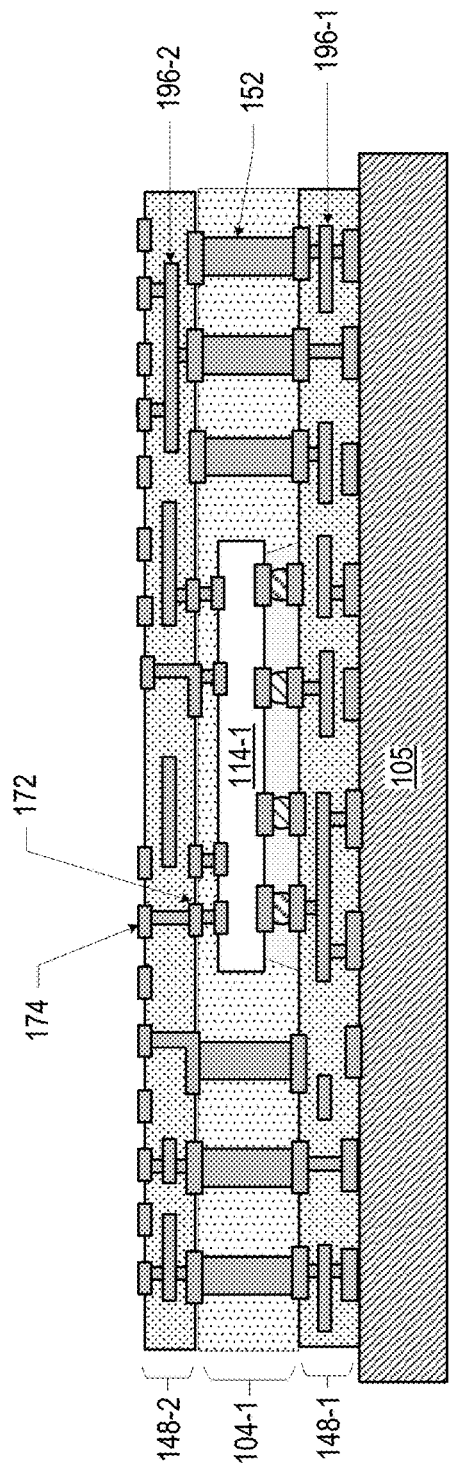

FIG. 3E illustrates an assembly subsequent to forming a second RDL 148-2 on a top surface of the assembly of FIG. 3D. The second RDL 148-2 may include conductive pathways 196-2 between conductive contacts 172 on a bottom surface and conductive contacts 174 on a top surface of the second RDL 148-2. The second RDL 148-2 may be manufactured using any suitable technique, such as a PCB technique or a redistribution layer technique.

Figure 3F:
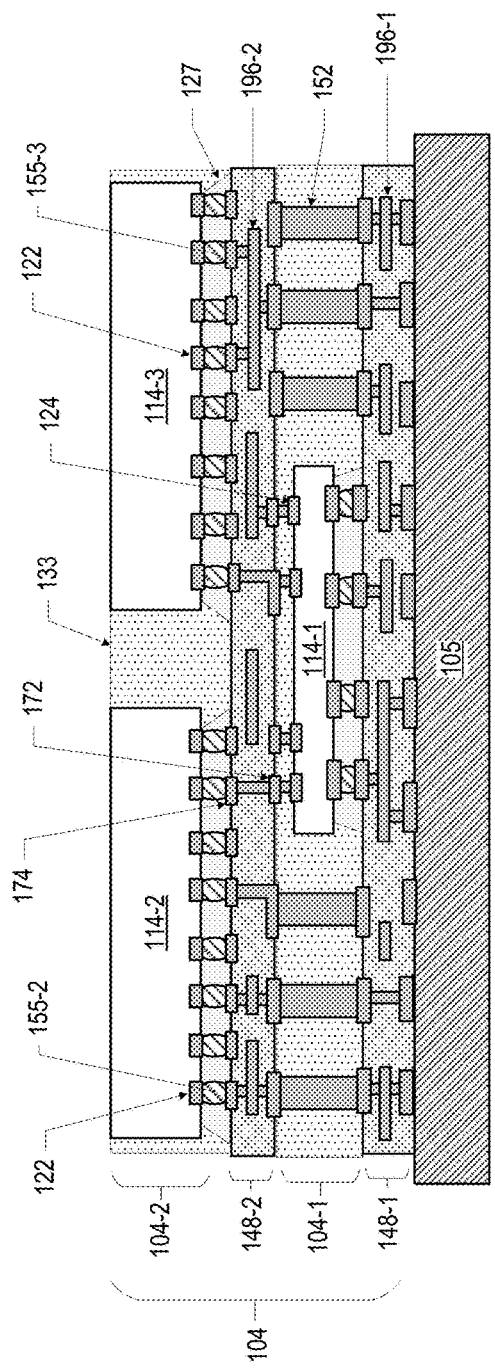

FIG. 3F illustrates an assembly subsequent to placing dies 114-2, 114-3 on a top surface of the assembly of FIG. 3E, forming second and third DTRDL interconnects 155-2, 155-3, and depositing an insulating material 133 on and around the dies 114-2, 114-3. Any suitable method may be used to place the dies 114-2, 114-3, for example, automated pick-and-place. The dies 114-2, 114-3 may include a set of first conductive contacts 122 on a bottom surface. In some embodiments, second and third DTRDL interconnects 155-2, 155-3 may include solder. In such embodiments, the assembly of FIG. 3F may be subjected to a solder reflow process during which solder components of second and third DTRDL interconnects 155-2, 155-3 melt and bond to mechanically and electrically couple the dies 114-2, 114-3 to the top surface of the second RDL 148-2. The insulating material 133 may include any suitable material and may be formed and removed using any suitable process, including as described above with reference to FIG. 3D. In some embodiments, the insulating material 133 in the first layer 104-1 (e.g., deposited in FIG. 3D) is different material than the insulating material 133 in the second layer 104-2 (e.g., deposited in FIG. 3F). In some embodiments, the insulating material 133 in the first layer 104-1 (e.g., deposited in FIG. 3D) is a same material as the insulating material 133 in the second layer 104-2 (e.g., deposited in FIG. 3F). In some embodiments, underfill 127 may be dispensed around the second and third DTRDL interconnects 155-2, 155-3 prior to depositing the insulating material 133. In some embodiments, underfill 127 around the second and third DTRDL interconnects 155-2, 155-3 may be omitted.

Figure 3G:
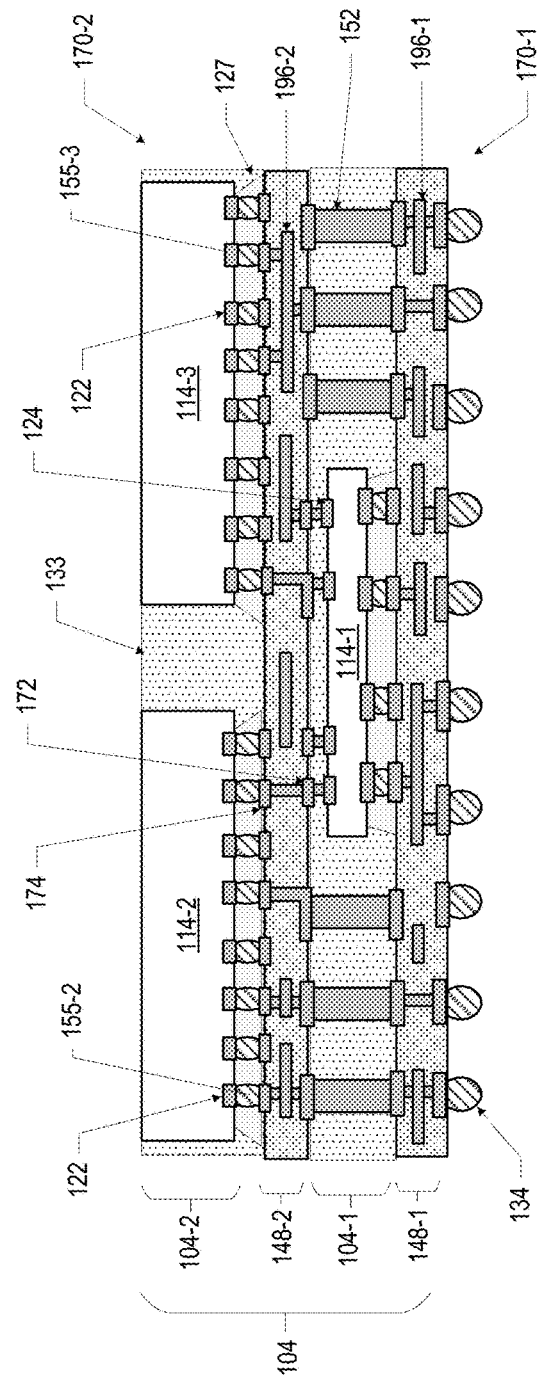

FIG. 3G illustrates an assembly subsequent to removing the carrier 105 and performing finishing operations, such as depositing solder resist (not shown) and depositing solder 134 on a bottom surface (e.g., at the first surface 170-1). In some embodiments, conductive contacts 172 on the bottom surface of the first RDL 148-1 may be formed subsequent to removing the carrier 105. If multiple assemblies are manufactured together, the assemblies may be singulated after removal of the carrier 105. The assembly of FIG. 3G may itself be a microelectronic assembly 100, as shown. Further manufacturing operations may be performed on the microelectronic assembly 100 of FIG. 3G to form other microelectronic assembly 100; for example, the solder 134 may be used to couple the microelectronic assembly 100 of FIG. 3G to a circuit board 102 via DCTB interconnects 150, similar to the microelectronic assembly 100 of FIG. 1.

Figure 4A:
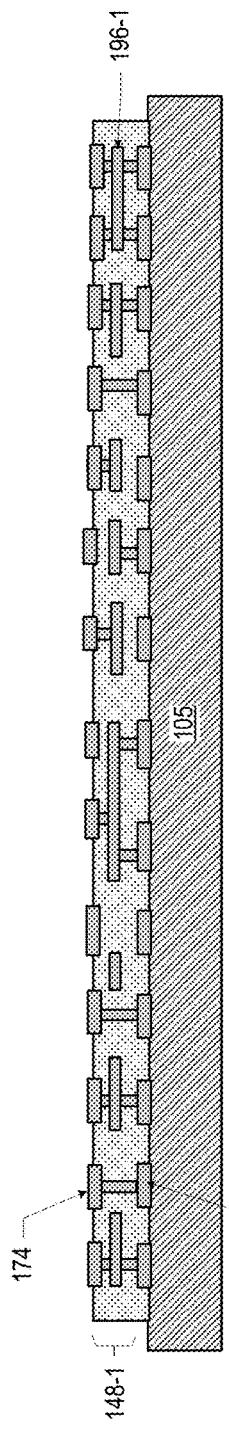
FIGS. 4A-4I are side, cross-sectional views of various stages in an example process for manufacturing the microelectronic assembly of FIG. 2, in accordance with various embodiments.

FIGS. 4A-4I are side, cross-sectional views of various stages in an example process for manufacturing the microelectronic assembly of FIG. 2, in accordance with various embodiments. FIG. 4A illustrates an assembly subsequent to forming a first RDL 148-1 on a carrier 105. A carrier 105 may include any suitable material for providing mechanical stability during manufacturing operations, and in some embodiments, may include a semiconductor wafer (e.g., a silicon wafer) or glass (e.g., a glass panel). The first RDL 148-1 may include conductive pathways 196-1 between conductive contacts 172 on a bottom surface and conductive contacts 174 on a top surface of the first RDL 148-1. The first RDL 148-1 may be manufactured using any suitable technique, such as a PCB technique or a redistribution layer technique.

Figure 4B:
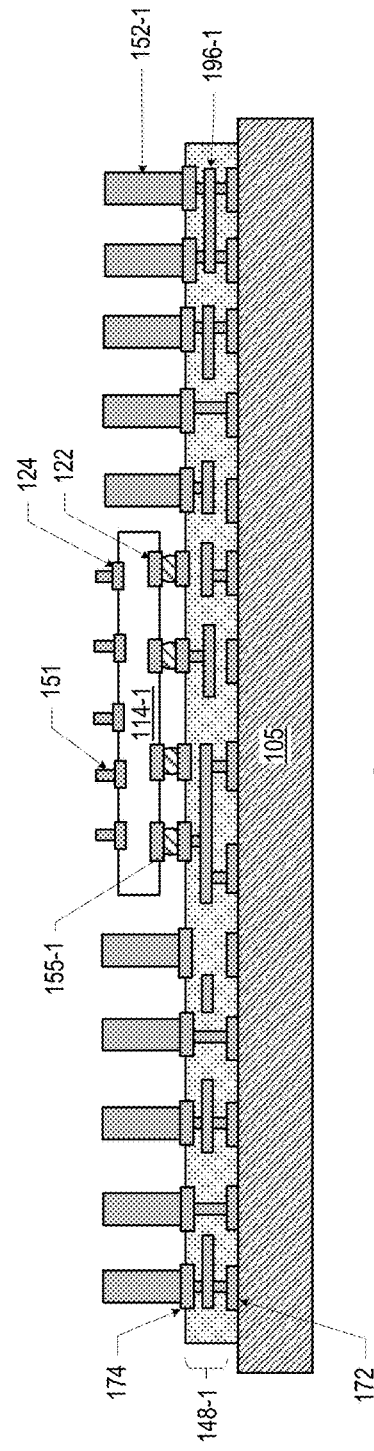

FIG. 4B illustrates an assembly subsequent to depositing a conductive material, such as copper, on a top surface of the first RDL 148-1 to generate first conductive pillars 152-1, placing die 114-1 a top surface of the first RDL 148-1, and forming first DTRDL interconnects 155-1. The first conductive pillars 152-1 may be formed using any suitable technique, for example, a lithographic process or an additive process, such as cold spray or 3-dimensional printing. The first conductive pillars 152-1 may have any suitable dimensions, as described above with reference to conductive pillars 152 in FIG. 3. Any suitable method may be used to place the die 114-1, for example, automated pick-and-place. The die 114-1 may include a set of first conductive contacts 122 on a bottom surface and a set of second conductive contacts 124 on a top surface. Additional metal traces and/or small pillars 151 may be formed on the die 114-1. In some embodiments, metal traces and/or small pillars 151 may be formed on the die 114-1 prior to placing them on the carrier 105. In some embodiments, first DTRDL interconnects 155-1 may include solder. In such embodiments, the assembly of FIG. 4B may be subjected to a solder reflow process during which solder components of first DTRDL interconnects 155-1 melt and bond to mechanically and electrically couple the die 114-1 to the top surface of the first RDL 148-1.

Figure 4C:
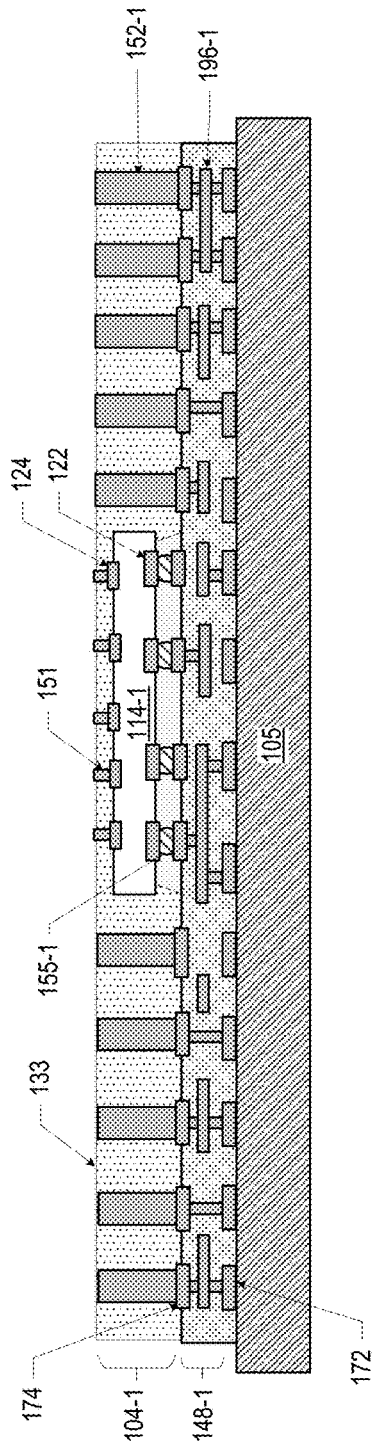

FIG. 4C illustrates an assembly subsequent to depositing an insulating material 133 on and around the die 114-1 and the first conductive pillars 152-1. The insulating material 133 may include any suitable material and may be formed and removed using any suitable process, including as described above with reference to FIG. 3. In some embodiments, underfill 127 may be dispensed around the DTRDL interconnects 155-1 prior to depositing the insulating material 133. In some embodiments, underfill 127 around the DTRDL interconnects 155-1 may be omitted.

Figure 4D:
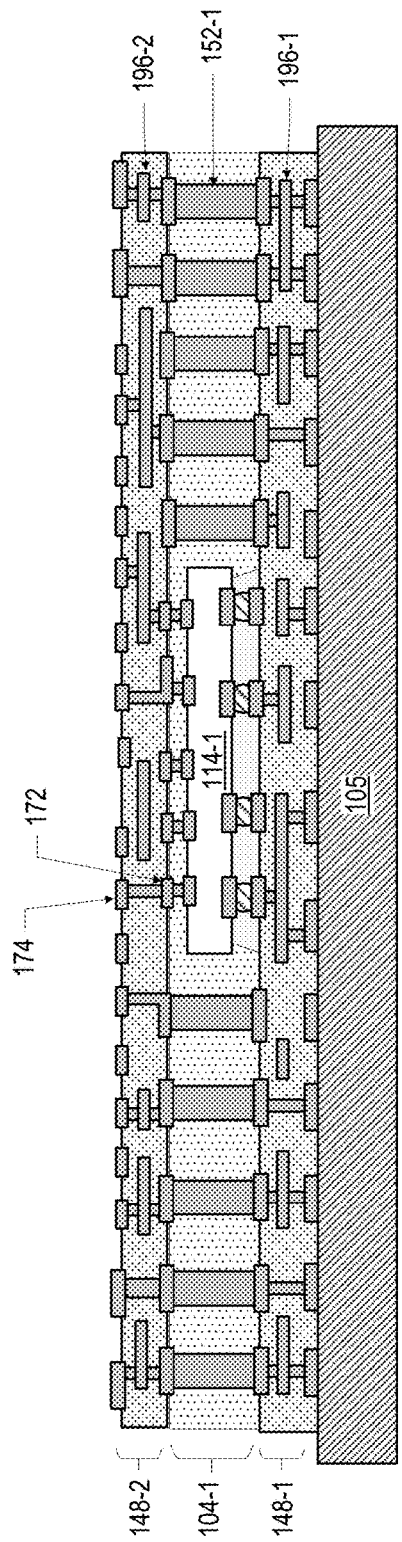

FIG. 4D illustrates an assembly subsequent to forming a second RDL 148-2 on a top surface of the assembly of FIG. 4C. The second RDL 148-2 may include conductive pathways 196-2 between conductive contacts 172 on a bottom surface and conductive contacts 174 on a top surface of the second RDL 148-2. The second RDL 148-2 may be manufactured using any suitable technique, such as a PCB technique or a redistribution layer technique.

Figure 4E:
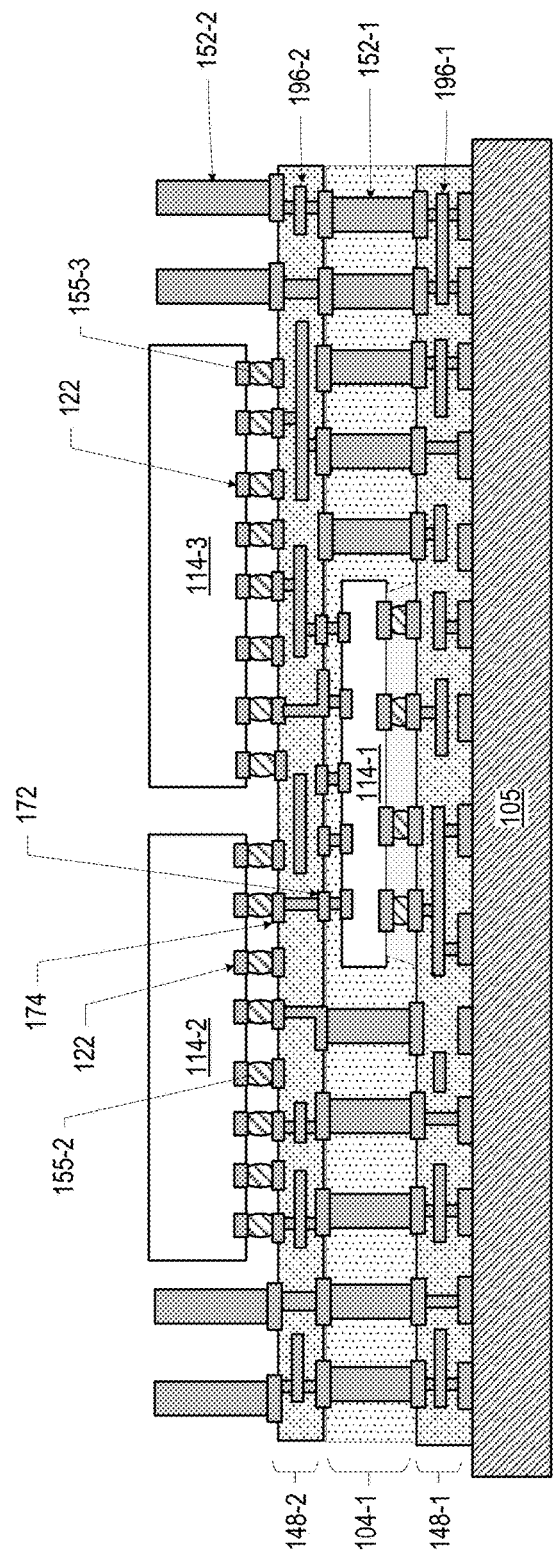

FIG. 4E illustrates an assembly subsequent to depositing a conductive material, such as copper, to generate second conductive pillars 152-2 on a top surface of the second RDL 148-2 (e.g., on a top surface of the assembly of FIG. 4D), placing dies 114-2, 114-3 on a top surface of the second RDL 148-2, and forming second and third DTRDL interconnects 155-2, 155-3. Any suitable method may be used to place the dies 114-2, 114-3, for example, automated pick-and-place. The dies 114-2, 114-3 may include a set of first conductive contacts 122 on a bottom surface. In some embodiments, second and third DTRDL interconnects 155-2, 155-3 may include solder. In such embodiments, the assembly of FIG. 4E may be subjected to a solder reflow process during which solder components of second and third DTRDL interconnects 155-2, 155-3 melt and bond to mechanically and electrically couple the dies 114-2, 114-3 to the top surface of the second RDL 148-2.

Figure 4F:
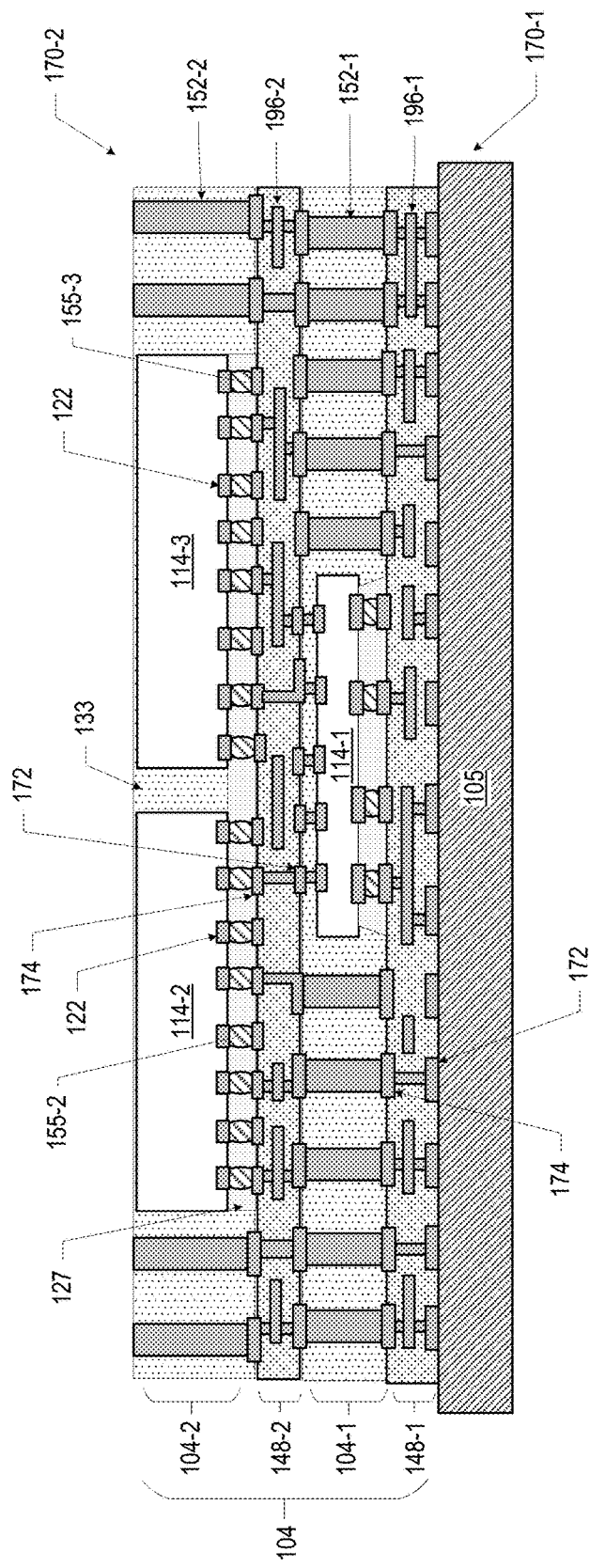

FIG. 4F illustrates an assembly subsequent to depositing an insulating material 133 on and around the dies 114-2, 114-3 and the second conductive pillars 152-2. The second conductive pillars 152-2 may be formed using any suitable technique, for example, a lithographic process or an additive process, such as cold spray or 3-dimensional printing. The second conductive pillars 152-2 may have any suitable dimension. In some embodiments, the second conductive pillars 152-2 may span one or more layers. For example, in some embodiments, an individual second conductive pillar 152-2 may have an aspect ratio (height:diameter) between 1:1 and 4:1 (e.g., between 1:1 and 3:1). In some embodiments, an individual second conductive pillar 152-2 may have a diameter (e.g., cross-section) between 10 microns and 1000 microns. For example, an individual second conductive pillar 152-2 may have a diameter between 150 microns and 300 microns. In some embodiments, an individual second conductive pillar 152-2 may have a height (e.g., z-height or thickness) between 150 microns and 300 microns. In some embodiments, the second conductive pillars 152-2 may have a pitch between 250 microns and 400 microns. The second conductive pillars 152-2 may have any suitable cross-sectional shape, for example, square, triangular, and oval, among others. The insulating material 133 may include any suitable material and may be formed and removed using any suitable process, including as described above with reference to FIG. 3. In some embodiments, the insulating material 133 in the first layer 104-1 (e.g., deposited in FIG. 4C) is different material than the insulating material 133 in the second layer 104-2 (e.g., deposited in FIG. 4F). In some embodiments, the insulating material 133 in the first layer 104-1 (e.g., deposited in FIG. 4C) is a same material as the insulating material 133 in the second layer 104-2 (e.g., deposited in FIG. 4F). In some embodiments, underfill 127 may be dispensed around the second and third DTRDL interconnects 155-2, 155-3 prior to depositing the insulating material 133. In some embodiments, underfill 127 around the second and third DTRDL interconnects 155-2, 155-3 may be omitted. The assembly of FIG. 4F may itself be a microelectronic assembly 100, as shown. Further manufacturing operations may be performed on the microelectronic assembly 100 of FIG. 4F to form other microelectronic assembly 100; for example, as shown in FIGS. 4G-4I.

Figure 4G:
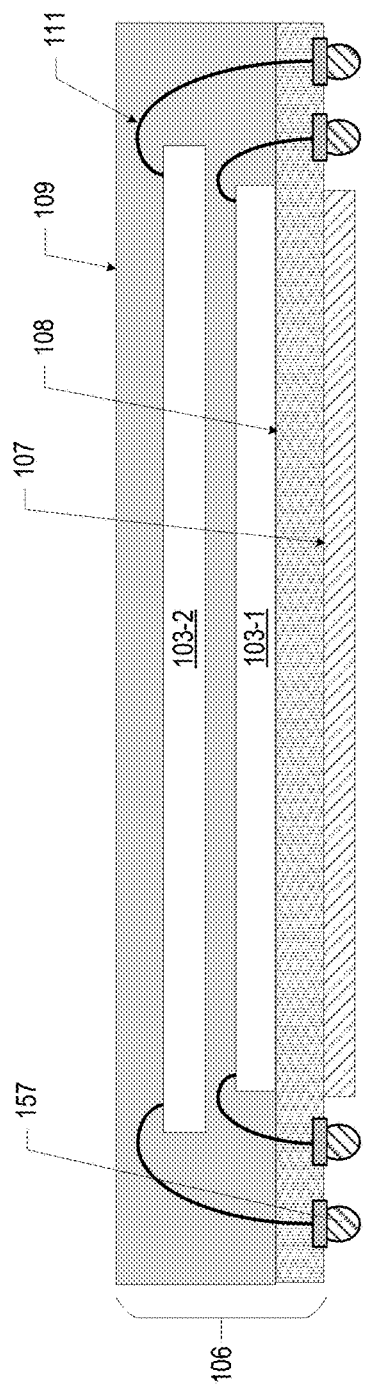

FIG. 4G illustrates a third-party package 106 including a first memory device 103-1 and a second memory device 103-2 having wire bonds 111 embedded in a mold material 109 on a substrate layer 108 with an adhesive 107 and solder interconnects 157.

Figure 4H:
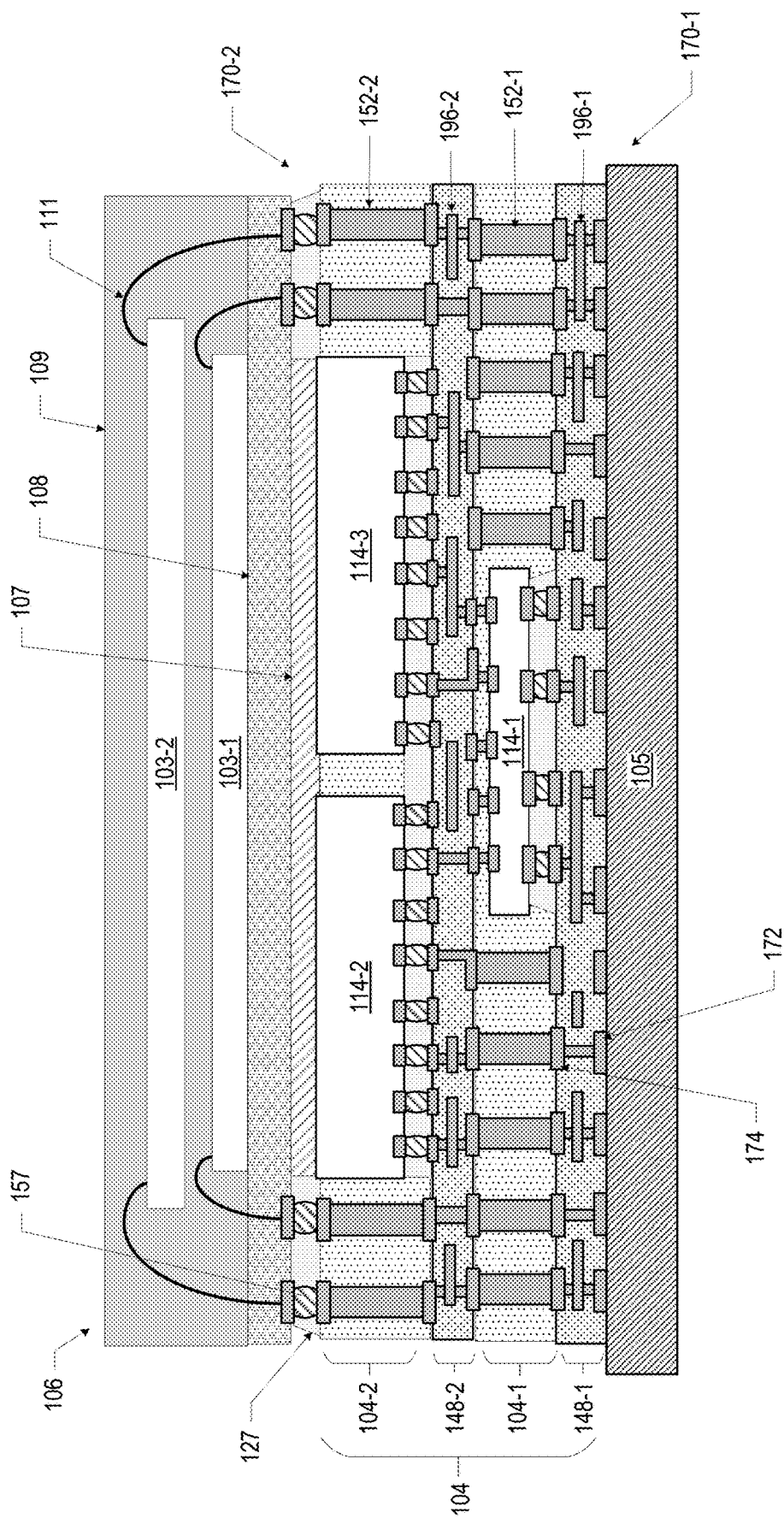

FIG. 4H illustrates an assembly subsequent to attaching the assembly of FIG. 4G to a top surface of the assembly of FIG. 4F. The assembly of FIG. 4H may be subjected to a solder reflow process during which solder components melt and bond to mechanically and electrically couple the assembly of FIG. 4G to the second conductive pillars 152-2 of the assembly of FIG. 4F. In some embodiments, underfill 127 may be dispensed around the solder interconnects 157. In some embodiments, underfill 127 around the solder interconnects 157 may be omitted.

Figure 4I:
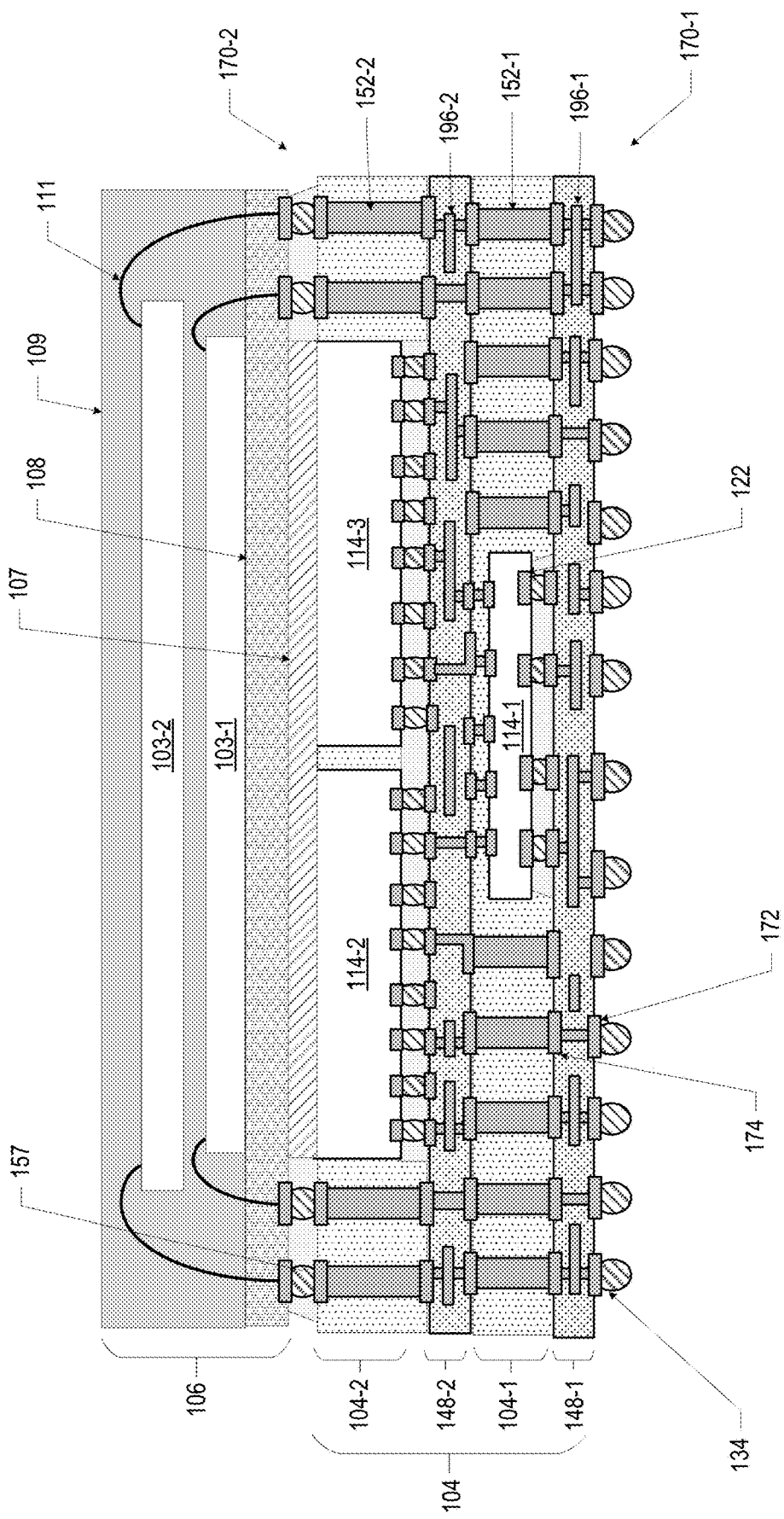

FIG. 4I illustrates an assembly subsequent to removing the carrier 105 and performing finishing operations, such as depositing solder resist (not shown) and depositing solder 134 on a bottom surface (e.g., at the first surface 170-1). In some embodiments, conductive contacts 172 on the bottom surface of the first RDL 148-1 may be formed subsequent to removing the carrier 105. If multiple assemblies are manufactured together, the assemblies may be singulated after removal of the carrier 105. The assembly of FIG. 4I may itself be a microelectronic assembly 100, as shown. Further manufacturing operations may be performed on the microelectronic assembly 100 of FIG. 4I to form other microelectronic assembly 100; for example, the solder 134 may be used to couple the microelectronic assembly 100 of FIG. 4I to a circuit board 102 via DCTB interconnects 150, similar to the microelectronic assembly 100 of FIG. 2.

The microelectronic assemblies 100 disclosed herein may be used for any suitable application. For example, in some embodiments, a microelectronic assembly 100 may be used to enable very small form factor voltage regulation for field programmable gate array (FPGA) or processing units (e.g., a central processing unit, a graphics processing unit, a FPGA, a modem, an applications processor, etc.) especially in mobile devices and small form factor devices. In another example, the die 114 in a microelectronic assembly 100 may be a processing device (e.g., a central processing unit, a graphics processing unit, a FPGA, a modem, an applications processor, etc.).

The microelectronic assemblies 100 disclosed herein may be included in any suitable electronic component. FIGS. 5-8 illustrate various examples of apparatuses that may include, or be included in, any of the microelectronic assemblies 100 disclosed herein.

Figure 5:
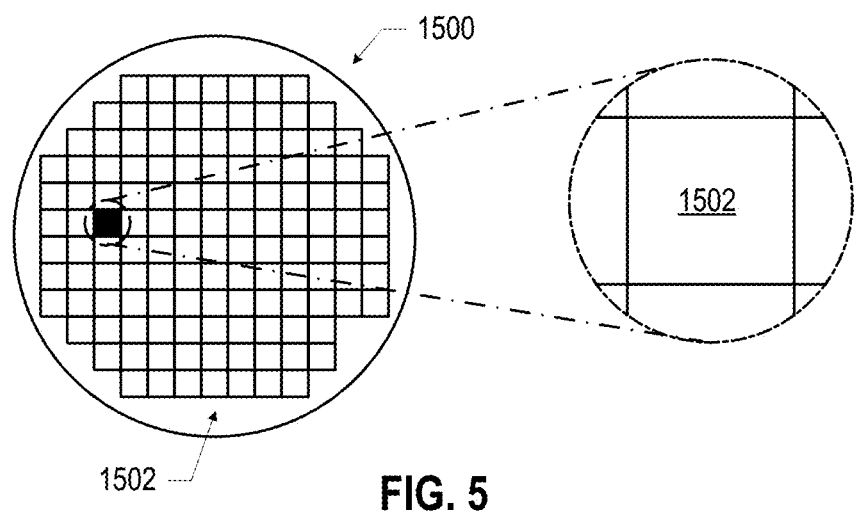
FIG. 5 is a top view of a wafer and dies that may be included in a microelectronic assembly, in accordance with any of the embodiments disclosed herein.

FIG. 5 is a top view of a wafer 1500 and dies 1502 that may be included in any of the microelectronic assemblies 100 disclosed herein (e.g., as any suitable ones of the dies 114). The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may be any of the dies 114 disclosed herein. The die 1502 may include one or more transistors (e.g., some of the transistors 1640 of FIG. 6, discussed below), supporting circuitry to route electrical signals to the transistors, passive components (e.g., signal traces, resistors, capacitors, or inductors), and/or any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 8) or other logic that is configured to store information in the memory devices or execute instructions stored in the memory array. In some embodiments, a die 1502 (e.g., a die 114) may be a central processing unit, a radio frequency chip, a power converter, or a network processor. Various ones of the microelectronic assemblies 100 disclosed herein may be manufactured using a die-to-wafer assembly technique in which some dies 114 are attached to a wafer 1500 that include others of the dies 114, and the wafer 1500 is subsequently singulated.

Figure 6:
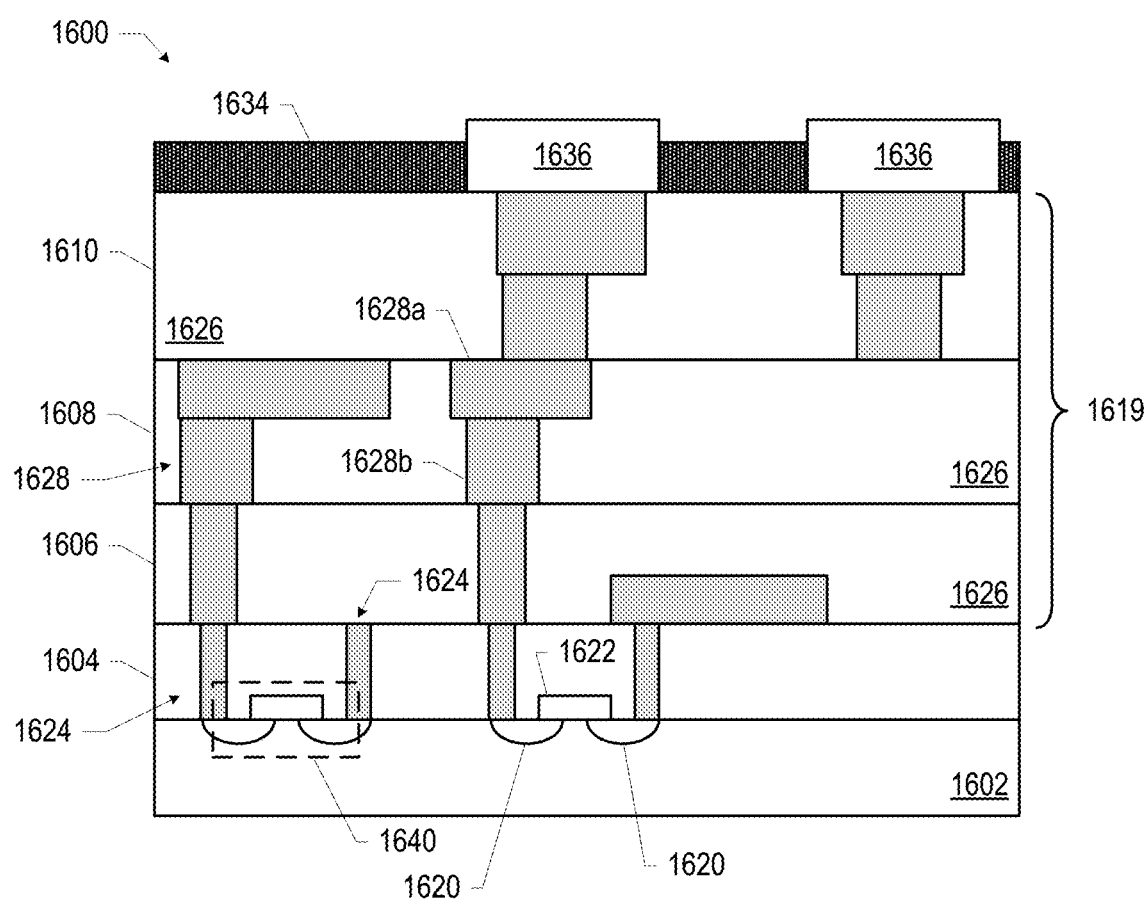
FIG. 6 is a cross-sectional side view of an IC device that may be included in a microelectronic assembly, in accordance with any of the embodiments disclosed herein.

FIG. 6 is a cross-sectional side view of an IC device 1600 that may be included in any of the microelectronic assemblies 100 disclosed herein (e.g., in any of the dies 114). One or more of the IC devices 1600 may be included in one or more dies 1502 (FIG. 5). The IC device 1600 may be formed on a die substrate 1602 (e.g., the wafer 1500 of FIG. 5) and may be included in a die (e.g., the die 1502 of FIG. 5). The die substrate 1602 may be a semiconductor substrate composed of semiconductor material systems including, for example, n-type or p-type materials systems (or a combination of both). The die substrate 1602 may include, for example, a crystalline substrate formed using a bulk silicon or a silicon-on-insulator (SOI) substructure. In some embodiments, the die substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1602. Although a few examples of materials from which the die substrate 1602 may be formed are described here, any material that may serve as a foundation for an IC device 1600 may be used. The die substrate 1602 may be part of a singulated die (e.g., the dies 1502 of FIG. 5) or a wafer (e.g., the wafer 1500 of FIG. 5).

The IC device 1600 may include one or more device layers 1604 disposed on the die substrate 1602. The device layer 1604 may include features of one or more transistors 1640 (e.g., metal oxide semiconductor field-effect transistors (MOSFETs)) formed on the die substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 6 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a PMOS or a NMOS transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the die substrate 1602 and two sidewall portions that are substantially perpendicular to the top surface of the die substrate 1602. In other embodiments, at least one of the metal layers that form the gate electrode may simply be a planar layer that is substantially parallel to the top surface of the die substrate 1602 and does not include sidewall portions substantially perpendicular to the top surface of the die substrate 1602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the die substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the die substrate 1602 to form the S/D regions 1620. An annealing process that activates the dopants and causes them to diffuse farther into the die substrate 1602 may follow the ion-implantation process. In the latter process, the die substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 6 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 6. Although a particular number of interconnect layers 1606-1610 is depicted in FIG. 6, embodiments of the present disclosure include IC devices having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the die substrate 1602 upon which the device layer 1604 is formed. For example, the lines 1628*a* may route electrical signals in a direction in and out of the page from the perspective of FIG. 6. The vias 1628*b* may be arranged to route electrical signals in a direction of a plane that is substantially perpendicular to the surface of the die substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 6. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 6, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

In some embodiments in which the IC device 1600 is a double-sided die (e.g., like the die 114-1), the IC device 1600 may include another metallization stack (not shown) on the opposite side of the device layer(s) 1604. This metallization stack may include multiple interconnect layers as discussed above with reference to the interconnect layers 1606-1610, to provide conductive pathways (e.g., including conductive lines and vias) between the device layer(s) 1604 and additional conductive contacts (not shown) on the opposite side of the IC device 1600 from the conductive contacts 1636.

In other embodiments in which the IC device 1600 is a double-sided die (e.g., like the die 114-1), the IC device 1600 may include one or more TSVs through the die substrate 1602; these TSVs may make contact with the device layer(s) 1604, and may provide conductive pathways between the device layer(s) 1604 and additional conductive contacts (not shown) on the opposite side of the IC device 1600 from the conductive contacts 1636.

Figure 7:
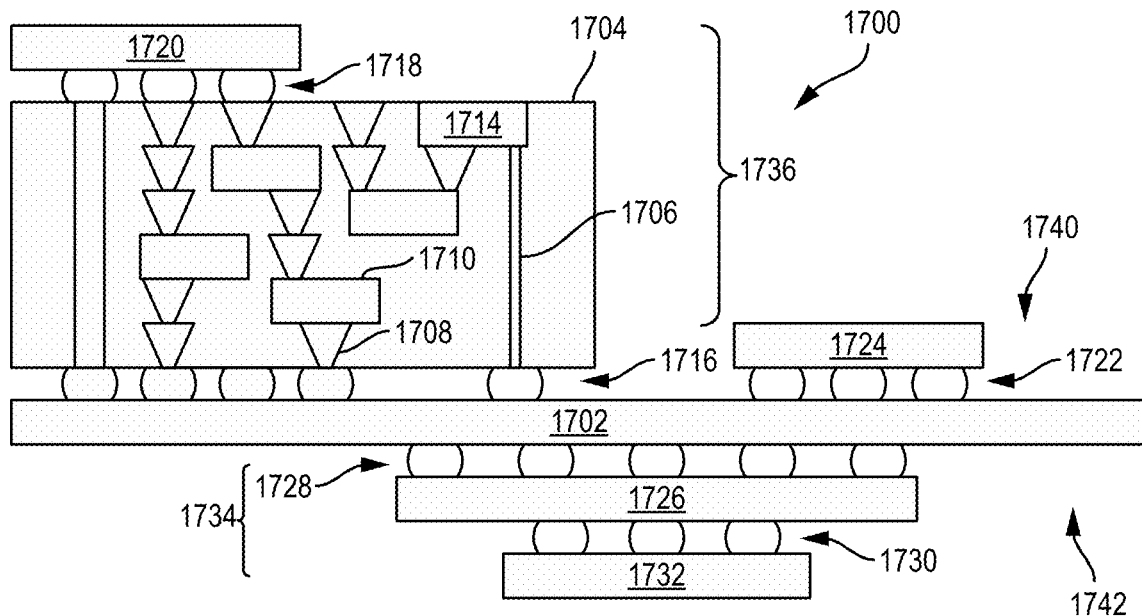
FIG. 7 is a cross-sectional side view of an IC device assembly that may include a microelectronic assembly, in accordance with any of the embodiments disclosed herein.

FIG. 7 is a cross-sectional side view of an IC device assembly 1700 that may include any of the microelectronic assemblies 100 disclosed herein. In some embodiments, the IC device assembly 1700 may be a microelectronic assembly 100. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any suitable ones of the embodiments of the microelectronic assemblies 100 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate. In some embodiments the circuit board 1702 may be, for example, a circuit board.

The IC device assembly 1700 illustrated in FIG. 7 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 7), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 7, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 5), an IC device (e.g., the IC device 1600 of FIG. 6), or any other suitable component. Generally, the interposer 1704 may spread a connection to a wider pitch or reroute a connection to a different connection. For example, the interposer 1704 may couple the IC package 1720 (e.g., a die) to a set of ball grid array (BGA) conductive contacts of the coupling components 1716 for coupling to the circuit board 1702. In the embodiment illustrated in FIG. 7, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 7 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 8:
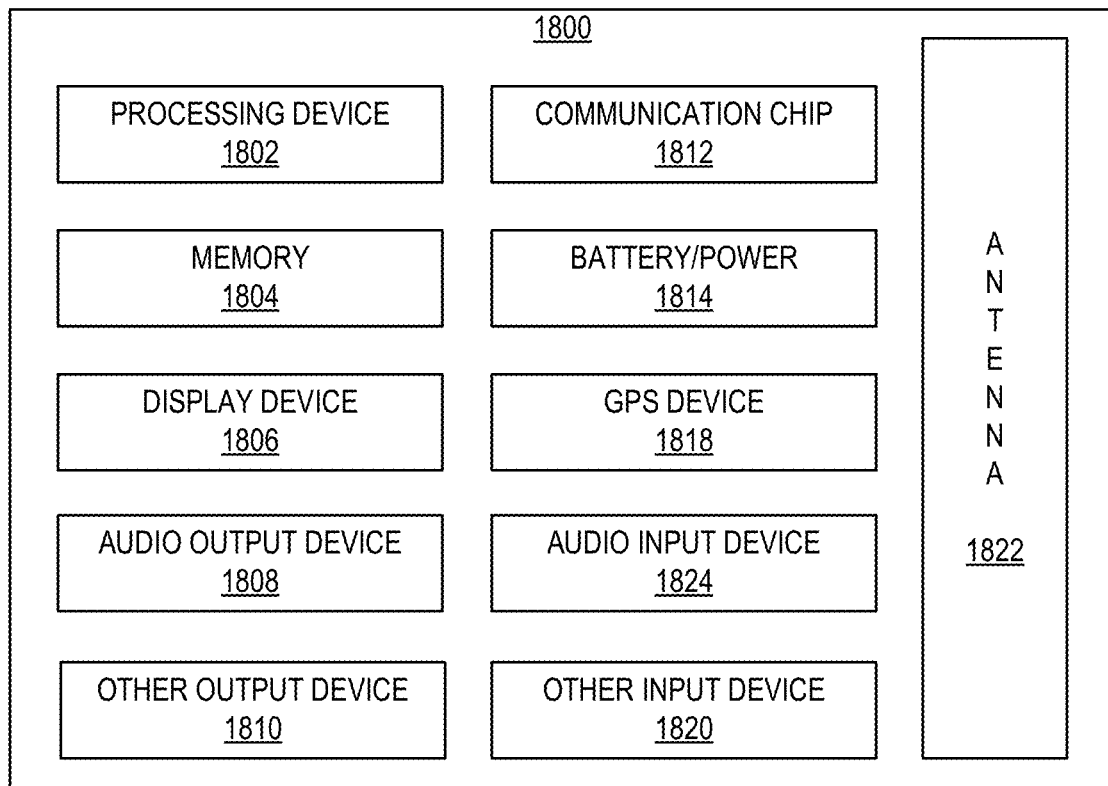
FIG. 8 is a block diagram of an example electrical device that may include a microelectronic assembly, in accordance with any of the embodiments disclosed herein.

FIG. 8 is a block diagram of an example electrical device 1800 that may include one or more of the microelectronic assemblies 100 disclosed herein. For example, any suitable ones of the components of the electrical device 1800 may include one or more of the IC device assemblies 1700, IC devices 1600, or dies 1502 disclosed herein, and may be arranged in any of the microelectronic assemblies 100 disclosed herein. A number of components are illustrated in FIG. 8 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 8, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-M RAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMLS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a computing device or a hand-held, portable or mobile computing device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server, or other networked computing component, a printer, a scanner, a monitor, a set-top box, an entertainment control unit, a vehicle control unit, a digital camera, a digital video recorder, or a wearable computing device. In some embodiments, the electrical device 1800 may be any other electronic device that processes data.

The following paragraphs provide various examples of the embodiments disclosed herein.

Example 1 is a microelectronic assembly, including a first redistribution layer (RDL), having a first surface, an opposing second surface, and first conductive pathways between the first and second surfaces, wherein the first surface of the first RDL includes first conductive contacts having a first pitch between 170 microns and 400 microns; a first die in a first layer, wherein the first layer is on the second surface of the first RDL; a conductive pillar in the first layer; a second RDL on the first layer, the second RDL having a first surface, an opposing second surface, and second conductive pathways between the first and second surfaces, wherein the second surface of the second RDL includes second conductive contacts having a second pitch between 18 microns and 150 microns; and a second die, in a second layer on the second RDL, wherein the second die is electrically coupled to the second conductive contacts and electrically coupled to the first conductive contacts via the first conductive pathways in the first RDL, the conductive pillar, the second conductive pathways in the second RDL, and the second conductive contacts.

Example 2 may include the subject matter of Example 1, and may further specify that the first die has a first surface facing the first RDL and an opposing second surface, and the first die further includes third conductive contacts at the second surface, wherein the first die is electrically coupled to the second die via the third conductive contacts, the second conductive pathways in the second RDL, and the second conductive contacts.

Example 3 may include the subject matter of Examples 1 or 2, and may further specify that the conductive pillar is one of a plurality of conductive pillars having a third pitch between 75 microns and 150 microns.

Example 4 may include the subject matter of any of Examples 1-3, and may further include a circuit board electrically coupled to the first conductive contacts.

Example 5 may include the subject matter of Example 4, and may further specify that the circuit board is electrically coupled to the first conductive contacts by solder.

Example 6 may include the subject matter of any of Examples 1-4, and may further specify that the second die is one of a plurality of second dies.

Example 7 may include the subject matter of any of Examples 1-4, and may further specify that the first die is one of a plurality of first dies.

Example 8 may include the subject matter of any of Examples 1-4, and may further specify that the second die is electrically coupled to the second conductive contacts by solder.

Example 9 may include the subject matter of any of Examples 1-4, and may further specify that the first layer and the second layer include one or more insulating materials.

Example 10 is a microelectronic assembly, including a first redistribution layer (RDL), having a first surface, an opposing second surface, and first conductive pathways between the first and second surfaces, wherein the first surface of the first RDL includes first interconnects having a first pitch between 170 microns and 400 microns; a first die, having a first surface and an opposing second surface, in a first layer, wherein the first layer is on the second surface of the first RDL; a conductive pillar in the first layer; a second RDL on the first layer; and a second die, having a first surface and an opposing second surface, in a second layer, wherein the second layer is on the second RDL, wherein the first surface of the second die includes second interconnects having a second pitch between 18 microns and 150 microns, and wherein respective ones of the first interconnects are electrically coupled to respective ones of the second interconnects via the first conductive pathways in the first RDL, the conductive pillar, and the second conductive pathways in the second RDL.

Example 11 may include the subject matter of Example 10, and may further specify that the second interconnects include solder.

Example 12 may include the subject matter of Example 10 or 11, and may further specify that the first die further includes a plurality of third interconnects at the second surface, wherein respective ones of the third interconnects are electrically coupled to respective ones of the second interconnects via the second conductive pathways in the second RDL.

Example 13 may include the subject matter of any of Examples 10-12, and may further specify that the conductive pillar is one of a plurality of conductive pillars, the plurality of conductive pillars having a third pitch between 75 microns and 150 microns.

Example 14 may include the subject matter of any of Examples 10-13, and may further include a circuit board electrically coupled to the first interconnects.

Example 15 may include the subject matter of Example 14, and may further specify that the circuit board is a printed circuit board (PCB) or a mother board.

Example 16 may include the subject matter of any of Examples 10-14, and may further specify that the first interconnects include solder.

Example 17 is a microelectronic assembly, including a first redistribution layer (RDL), having a first surface, an opposing second surface, and first conductive pathways between the first and second surfaces, wherein the first surface of the first RDL includes first interconnects having a first pitch between 170 microns and 400 microns; a first die, having a first surface and an opposing second surface, in a first layer, wherein the first layer is on the second surface of the first RDL; first conductive pillars in the first layer; a second RDL on the first layer; a second die, having a first surface and an opposing second surface, in a second layer, wherein the second layer is on the second RDL, wherein the first surface of the second die includes second interconnects having a second pitch between 18 microns and 150 microns, and wherein respective ones of the first interconnects are electrically coupled to respective ones of the second interconnects via the first conductive pathways in the first RDL, the first conductive pillars, and the second conductive pathways in the second RDL; second conductive pillars in the second layer; and an in-package memory at the second surface of the second die and electrically coupled to the second conductive pillars.

Example 18 may include the subject matter of Example 17, and may further specify that the second interconnects include solder.

Example 19 may include the subject matter of Example 17 or 18, and may further specify that a pitch of the first conductive pillars is between 75 microns and 150 microns.

Example 20 may include the subject matter of any of Examples 17-19, and may further specify that a pitch of the second conductive pillars is between 150 microns and 250 microns.

Example 21 is a method of manufacturing a microelectronic assembly, including forming a first redistribution layer (RDL), having a first surface with first conductive contacts having a first pitch between 170 microns and 400 microns, an opposing second surface, and first conductive pathways between the first and second surfaces, on a carrier with the first surface facing towards the carrier; forming a conductive pillar on the second surface of the first RDL and electrically coupling the conductive pillar to the first RDL; electrically coupling a first die to the second surface of the first RDL; forming an insulating material around the first die and the conductive pillar; forming a second RDL, having a first surface, an opposing second surface with second conductive contacts having a second pitch between 18 microns and 150 microns, and second conductive pathways between the first and second surfaces, on the insulating material with the first surface facing towards the insulating material and electrically coupling the second RDL to the first die and the conductive pillar; and electrically coupling a second die to the second conductive contacts at the second surface of the second RDL, wherein the second die is electrically coupled to the first conductive contacts at the first surface of the first RDL via the first conductive pathways in the first RDL, the conductive pillar, and the second conductive pathways in the second RDL.

Example 22 may include the subject matter of Example 21, and may further specify that the insulating material is a first insulating material, wherein the conductive pillar is one of a plurality of first conductive pillars, and wherein the second die has a first surface facing towards the second RDL and an opposing second surface, and the method and may further include: forming a plurality of second conductive pillars on the second surface of the second RDL; forming a second insulating material around the second die and the plurality of second conductive pillars; attaching an in-package memory at the second surface of the second die; and electrically coupling the in-package memory to respective ones of the plurality of second conductive pillars.

Example 23 may include the subject matter of Example 22, and may further specify that the plurality of first conductive pillars has a third pitch between 75 microns and 150 microns.

Example 24 may include the subject matter of Example 22, and may further specify that the plurality of second conductive pillars has a fourth pitch between 150 microns and 250 microns.

The invention claimed is:

1. A microelectronic assembly, comprising:
    a first redistribution layer (RDL), having a first surface, an opposing second surface, and first conductive pathways between the first and second surfaces, wherein the first surface of the first RDL includes first conductive contacts having a first pitch between 170 microns and 400 microns;
    a first die in a first layer, wherein the first layer is on the second surface of the first RDL;
    a conductive pillar in the first layer;
    a second RDL on the first layer, the second RDL having a first surface, an opposing second surface, and second conductive pathways between the first and second surfaces, wherein the second surface of the second RDL includes second conductive contacts having a second pitch between 18 microns and 150 microns; and
    a second die, in a second layer on the second RDL, wherein the second die is electrically coupled to the second conductive contacts and electrically coupled to the first conductive contacts via the first conductive pathways in the first RDL, the conductive pillar, the second conductive pathways in the second RDL, and the second conductive contacts.

2. The microelectronic assembly of claim 1, wherein the first die has a first surface facing the first RDL and an opposing second surface, and the first die further includes:
    third conductive contacts at the second surface, wherein the first die is electrically coupled to the second die via the third conductive contacts, the second conductive pathways in the second RDL, and the second conductive contacts.

3. The microelectronic assembly of claim 1, wherein the conductive pillar is one of a plurality of conductive pillars having a third pitch between 75 microns and 150 microns.

4. The microelectronic assembly of claim 1, further comprising:
    a circuit board electrically coupled to the first conductive contacts.

5. The microelectronic assembly of claim 4, wherein the circuit board is electrically coupled to the first conductive contacts by solder.

6. The microelectronic assembly of claim 1, wherein the second die is one of a plurality of second dies.

7. The microelectronic assembly of claim 1, wherein the first die is one of a plurality of first dies.

8. The microelectronic assembly of claim 1, wherein the second die is electrically coupled to the second conductive contacts by solder.

9. The microelectronic assembly of claim 1, wherein the first layer and the second layer include one or more insulating materials.

10. A microelectronic assembly, comprising:
    a first redistribution layer (RDL), having a first surface, an opposing second surface, and first conductive pathways between the first and second surfaces, wherein the first surface of the first RDL includes first interconnects having a first pitch between 170 microns and 400 microns;
    a first die, having a first surface and an opposing second surface, in a first layer, wherein the first layer is on the second surface of the first RDL;
    a conductive pillar in the first layer;
    a second RDL on the first layer; and
    a second die, having a first surface and an opposing second surface, in a second layer, wherein the second layer is on the second RDL, wherein the first surface of the second die includes second interconnects having a second pitch between 18 microns and 150 microns, and wherein respective ones of the first interconnects are electrically coupled to respective ones of the second interconnects via the first conductive pathways in the first RDL, the conductive pillar, and the second conductive pathways in the second RDL.

11. The microelectronic assembly of claim 10, wherein the second interconnects include solder.

12. The microelectronic assembly of claim 10, wherein the first die further includes:
    a plurality of third interconnects at the second surface, wherein respective ones of the third interconnects are electrically coupled to respective ones of the second interconnects via the second conductive pathways in the second RDL.

13. The microelectronic assembly of claim 10, wherein the conductive pillar is one of a plurality of conductive pillars, the plurality of conductive pillars having a third pitch between 75 microns and 150 microns.

14. The microelectronic assembly of claim 10, further comprising:
    a circuit board electrically coupled to the first interconnects.

15. The microelectronic assembly of claim 14, wherein the circuit board is a printed circuit board (PCB) or a mother board.

16. The microelectronic assembly of claim 14, wherein the first interconnects include solder.

* * * * *